(12) United States Patent
Nakamura et al.

(10) Patent No.: US 10,811,448 B2
(45) Date of Patent: Oct. 20, 2020

(54) SOLID-STATE IMAGING DEVICE

(71) Applicant: CANON KABUSHIKI KAISHA, Tokyo (JP)

(72) Inventors: Kohichi Nakamura, Kawasaki (JP); Masaaki Iwane, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 143 days.

(21) Appl. No.: 15/936,386

(22) Filed: Mar. 26, 2018

(65) Prior Publication Data
US 2018/0219037 A1 Aug. 2, 2018

Related U.S. Application Data

(63) Continuation of application No. 15/217,537, filed on Jul. 22, 2016, now Pat. No. 9,966,398.

(30) Foreign Application Priority Data

Aug. 13, 2015 (JP) ................................. 2015-159755

(51) Int. Cl.
*H01L 27/146* (2006.01)
*H04N 5/378* (2011.01)

(52) U.S. Cl.
CPC .. *H01L 27/14612* (2013.01); *H01L 27/14605* (2013.01); *H01L 27/14609* (2013.01); *H04N 5/378* (2013.01)

(58) Field of Classification Search
CPC ..... H04N 5/3745–37455; H04N 5/378; H04N 5/3355; H04N 5/335–378; H03M 1/00–645; H01L 27/146–14893

USPC ................ 341/155–172; 348/308, 294–324
See application file for complete search history.

(56) References Cited

U.S. PATENT DOCUMENTS

| | | |
|---|---|---|
| 6,534,336 B1 | 3/2003 | Iwane |
| 7,935,995 B2 | 5/2011 | Watanabe |
| 8,111,311 B2 | 2/2012 | Iwane |
| 8,139,133 B2 | 3/2012 | Iwane |
| 8,222,682 B2 | 7/2012 | Watanabe |
| 8,325,260 B2 | 12/2012 | Yamazaki |
| 8,345,137 B2 | 1/2013 | Shinohara |
| 8,451,360 B2 | 5/2013 | Nakamura |

(Continued)

FOREIGN PATENT DOCUMENTS

JP 2000-286706 10/2000

*Primary Examiner* — Xi Wang
(74) *Attorney, Agent, or Firm* — Venable LLP

(57) ABSTRACT

A solid-state imaging device includes a plurality of pixels, a reference signal supply unit configured to output a reference signal, and a comparison unit configured to output a signal depending on the reference signal and a signal from the pixel. The comparison unit includes a comparator circuit including an input terminal and an output terminal, a first switch configured to connect the input terminal and the output terminal of the comparator circuit, a clamp capacitor including a first terminal connected to the input terminal of the comparator circuit, a second switch connected to a second terminal of the clamp capacitor, and configured to select one of the signal from the pixel and the reference signal and to input the selected signal to the second terminal, and a clipping circuit arranged in an electrical path through which the reference signal is input to the comparator circuit.

21 Claims, 15 Drawing Sheets

(56) References Cited

U.S. PATENT DOCUMENTS

| | | |
|---|---|---|
| 8,598,901 B2 | 12/2013 | Hiyama |
| 8,711,259 B2 | 4/2014 | Maehashi |
| 8,810,706 B2 | 8/2014 | Yamazaki |
| 8,836,838 B2 | 9/2014 | Nakamura |
| 8,928,786 B2 | 1/2015 | Iwata |
| 9,001,249 B2 | 4/2015 | Iwane |
| 9,029,752 B2 | 5/2015 | Saito |
| 9,053,996 B2 | 6/2015 | Iwane |
| 9,083,906 B2 | 7/2015 | Nakamura |
| 9,118,857 B2 | 8/2015 | Iwata |
| 9,131,178 B2 | 9/2015 | Nakamura |
| 9,232,164 B2 | 1/2016 | Minowa |
| 9,232,165 B2 | 1/2016 | Saito |
| 2006/0170803 A1 | 8/2006 | Lim |
| 2009/0303358 A1 | 12/2009 | Kawahito |
| 2009/0316034 A1* | 12/2009 | Kusuda ............... H04N 5/374 348/308 |
| 2010/0039543 A1 | 2/2010 | Muroshima et al. |
| 2010/0052733 A1 | 3/2010 | Yamamoto et al. |
| 2010/0157035 A1* | 6/2010 | Purcell ............. H04N 5/3355 348/65 |
| 2011/0085065 A1 | 4/2011 | Egawa |
| 2011/0261177 A1* | 10/2011 | Moore ................ H04N 5/378 348/65 |
| 2011/0279720 A1 | 11/2011 | Nakagawa et al. |
| 2011/0309235 A1* | 12/2011 | Yoshida ............ H03M 1/1023 250/208.1 |
| 2014/0043511 A1 | 2/2014 | Iwata et al. |
| 2014/0098272 A1* | 4/2014 | Nakamura ........ H04N 5/37455 348/308 |
| 2014/0333815 A1 | 11/2014 | Iwane |
| 2014/0340555 A1 | 11/2014 | Iwane |
| 2015/0042856 A1* | 2/2015 | Nakamura ............ H04N 5/378 348/297 |
| 2015/0122975 A1 | 5/2015 | Saito |
| 2015/0201144 A1 | 7/2015 | Kobayashi |
| 2015/0229832 A1 | 8/2015 | Itano |
| 2015/0237286 A1 | 8/2015 | Saito |
| 2015/0319380 A1* | 11/2015 | Yoshida ............... H04N 5/243 348/301 |
| 2015/0380449 A1* | 12/2015 | Inoue ............... H01L 27/14643 250/208.1 |
| 2016/0057372 A1 | 2/2016 | Iwane |
| 2016/0064442 A1 | 3/2016 | Takada |
| 2016/0227141 A1 | 8/2016 | Kobayashi |

* cited by examiner

SOLID-STATE IMAGING DEVICE

This application is a continuation of application Ser. No. 15/217,537, filed Jul. 22, 2016.

BACKGROUND OF THE INVENTION

Field of the Invention

The present invention relates to a solid-state imaging device including an AD converter.

Description of the Related Art

There is a technology in the field of solid-state imaging devices, in which an analog-to-digital converter (hereinafter referred to as AD converter) is arranged in each column of pixels in an array-like arrangement and a signal from each pixel is converted into digital data. In Japanese Patent Application Laid-Open No. 2000-286706, there is disclosed a technology in which an inverter is used for a comparator circuit included in each AD converter.

In the technology disclosed in Japanese Patent Application Laid-Open No. 2000-286706, a signal from a pixel is input to a sampling capacitor during sampling, and a reference signal is input to an inverter via the sampling capacitor during AD conversion. Digital data is acquired through storing a time at which an output potential of the inverter is inverted to perform the AD conversion.

However, in the technology described in Japanese Patent Application Laid-Open No. 2000-286706, the conversion range of the AD conversion is limited by a range of voltage that can be input to the inverter. In other words, the upper and lower limits of the potential of the reference signal are limited by the range of voltage that can be input to the inverter, and thus, it is difficult to realize a high S/N ratio. Further, in order to increase the range of voltage that can be input to the inverter, it is necessary to increase a power supply voltage, which increases power consumption.

SUMMARY OF THE INVENTION

An object of the present invention is to provide a high-performance solid-state imaging device that can realize improvement in S/N ratio and reduced power consumption.

According to one aspect of the present invention, there is provided a solid-state imaging device including a plurality of pixels arranged so as to form a plurality of columns, a reference signal supply unit configured to output a reference signal, and a comparison unit configured to output a signal depending on the reference signal and a signal from a pixel among the plurality of pixels, wherein the comparison unit includes a comparator circuit including an input terminal and an output terminal, a first switch configured to connect the input terminal and the output terminal of the comparator circuit, a clamp capacitor including a first terminal connected to the input terminal of the comparator circuit, a second switch connected to a second terminal of the clamp capacitor, the second switch being configured to select any one of the signal from the pixel and the reference signal and to input the selected signal to the second terminal, and a clipping circuit arranged in an electrical path through which the reference signal is input to the comparator circuit.

According to another aspect of the present invention, there is provided a comparator configured to output a signal depending on a first signal and a second signal, including a comparator circuit including an input terminal and an output terminal, a first switch configured to connect the input terminal and the output terminal of the comparator circuit, a clamp capacitor including a first terminal connected to the input terminal of the comparator circuit, a second switch connected to a second terminal of the clamp capacitor, the second switch being configured to select one of the first signal and the second signal and to input the selected signal to the second terminal, and a clipping circuit arranged in an electrical path through which the second signal is input to the comparator circuit.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
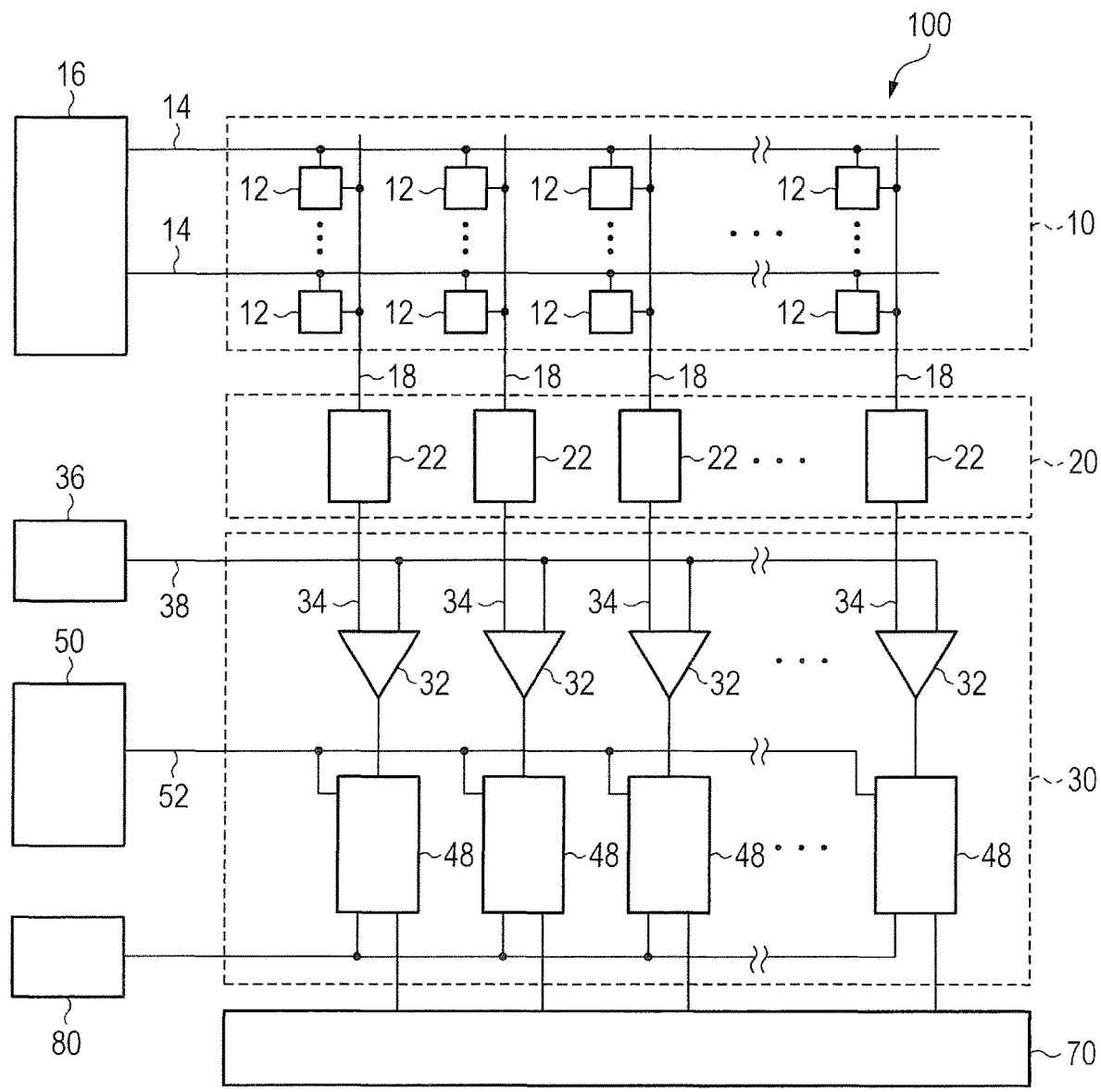
FIG. 1 is a block diagram for illustrating a solid-state imaging device according to a first embodiment of the present invention.
Figure 2:
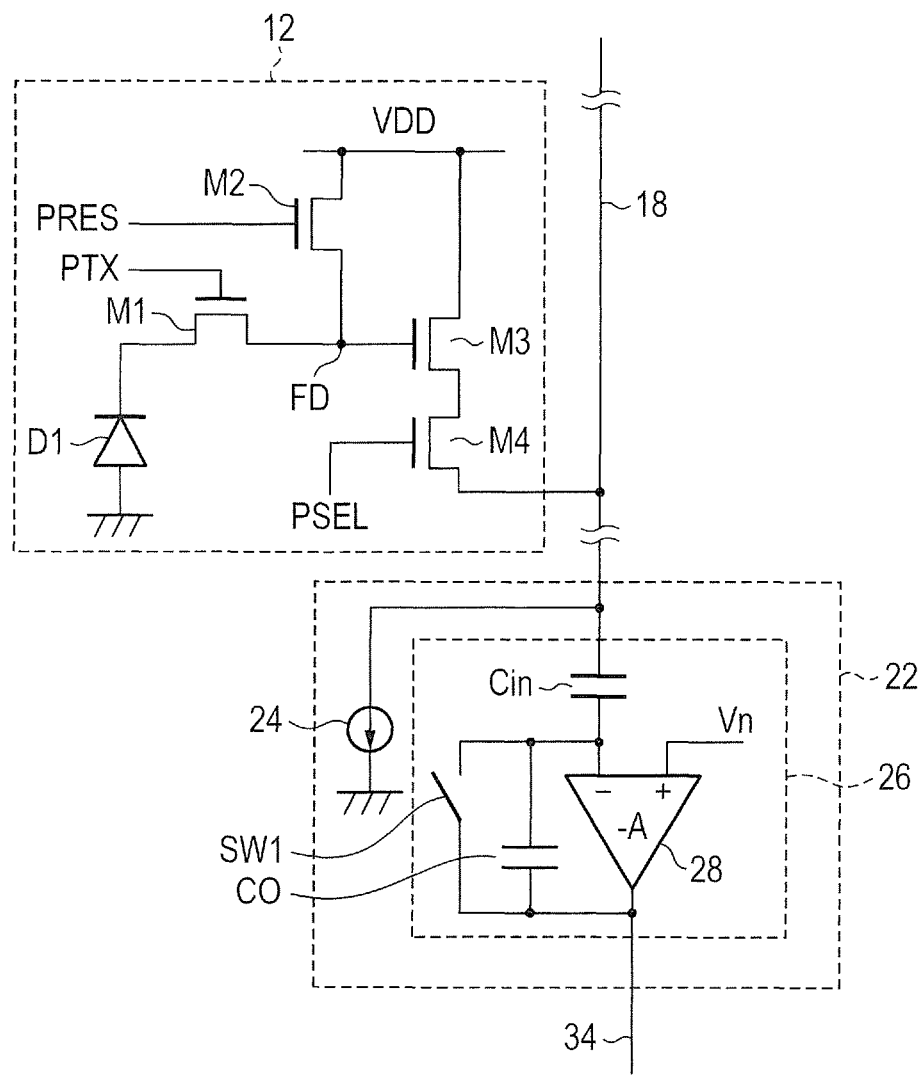
FIG. 2 is a circuit diagram for illustrating a pixel and a column readout circuit unit of the solid-state imaging device according to the first embodiment of the present invention.
Figure 3:
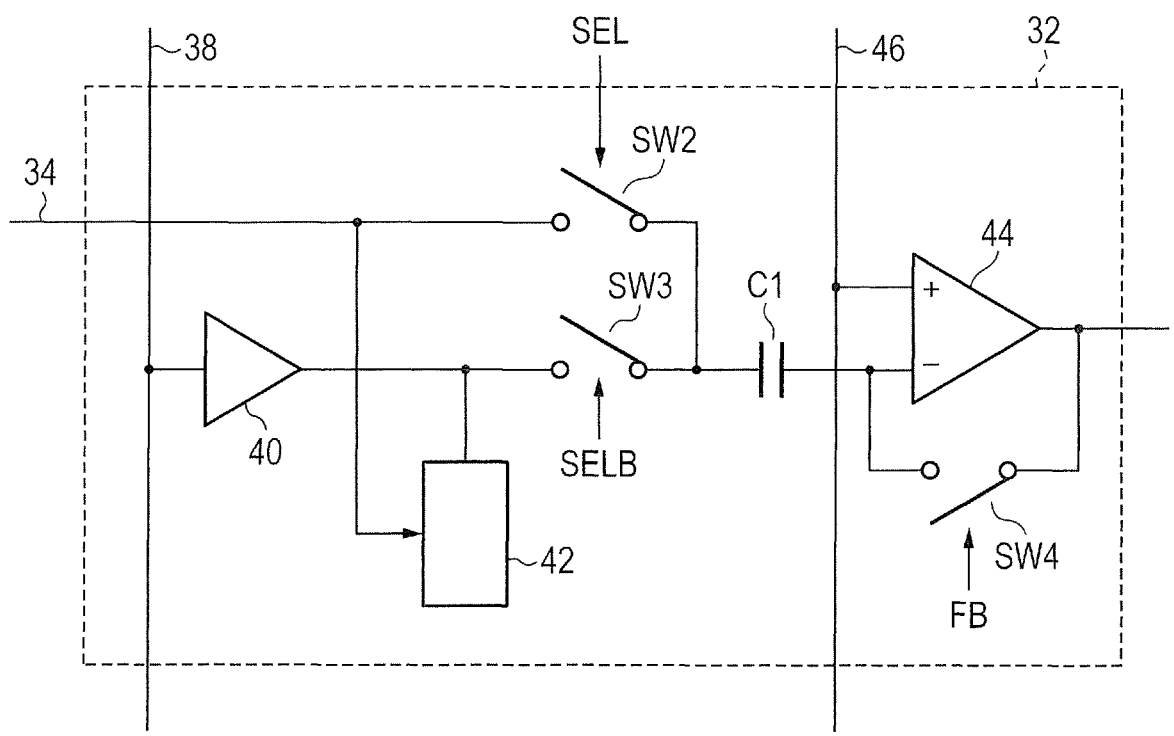
FIG. 3 is a circuit diagram for illustrating a comparison unit of the solid-state imaging device according to the first embodiment of the present invention.
Figure 4:
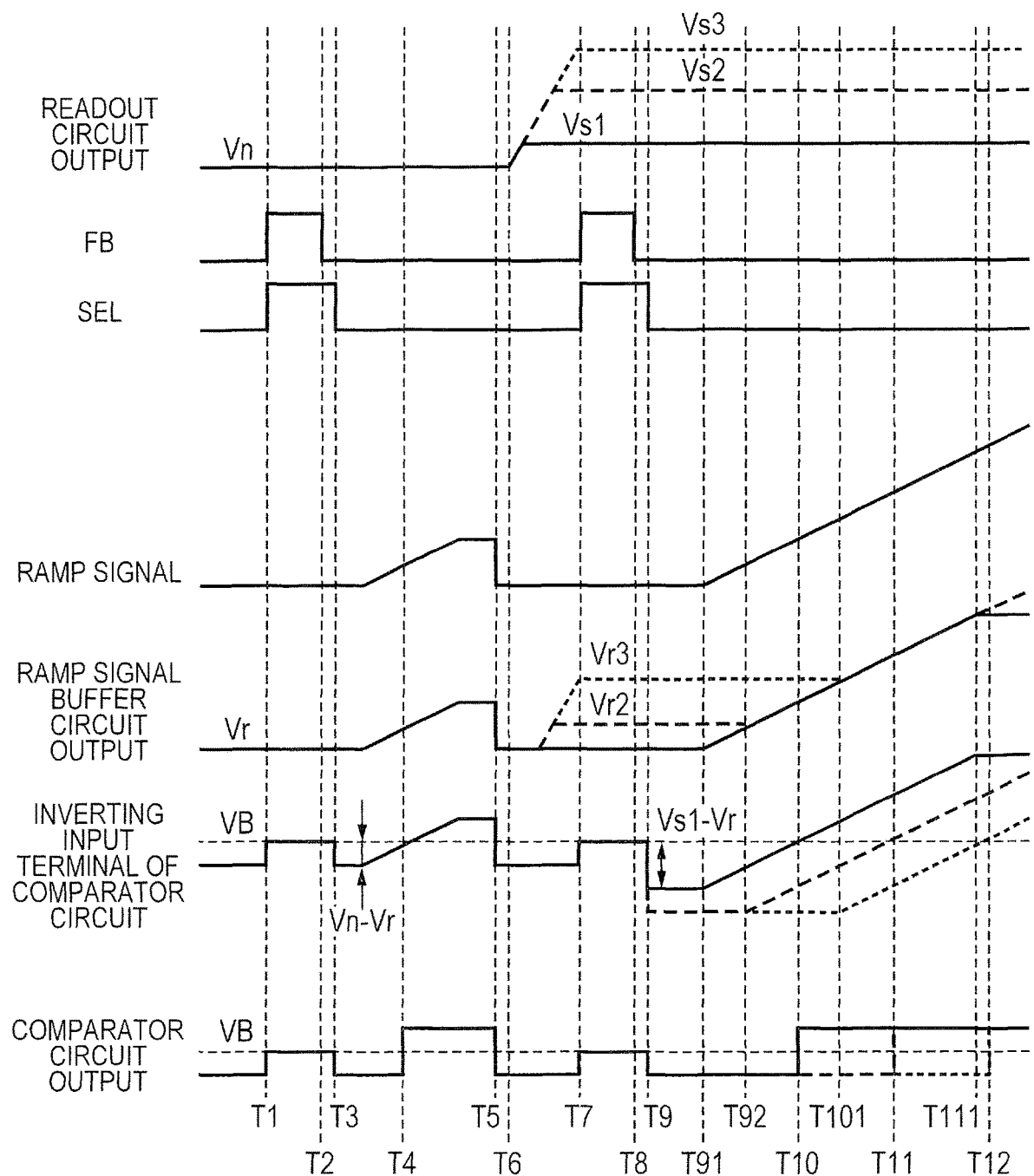
FIG. 4 is a timing chart for illustrating operation of the solid-state imaging device according to the first embodiment of the present invention.
Figure 5:
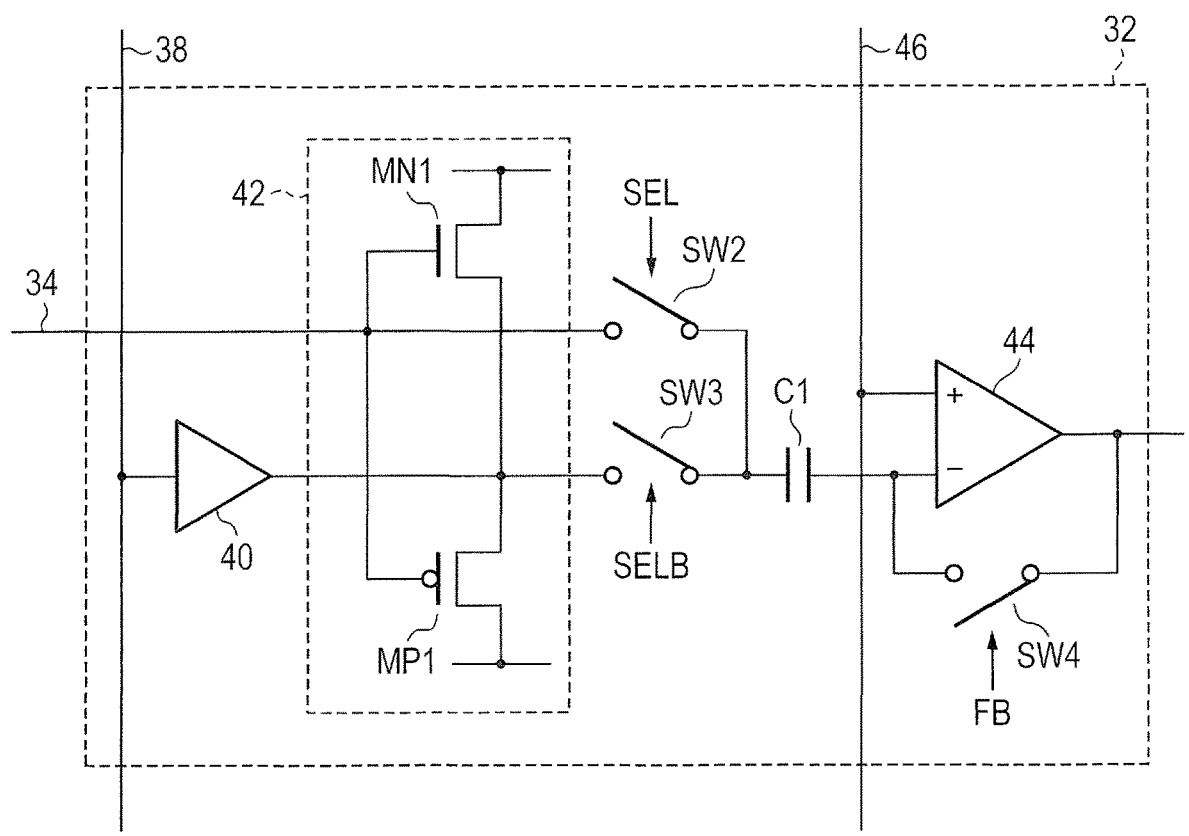
FIG. 5 is a circuit diagram for illustrating a clipping circuit of the solid-state imaging device according to the first embodiment of the present invention.

A solid-state imaging device according to a first embodiment of the present invention is described with reference to FIG. 1 to FIG. 5. FIG. 1 is a block diagram for illustrating a schematic configuration of a solid-state imaging device according to the present embodiment. FIG. 2 is a circuit diagram for illustrating a pixel and a column readout circuit unit of the solid-state imaging device according to the present embodiment. FIG. 3 is a circuit diagram for illustrating a comparison unit of the solid-state imaging device according to the present embodiment. FIG. 4 is a timing chart for illustrating operation of the solid-state imaging device according to the present embodiment. FIG. 5 is a circuit diagram for illustrating a clipping circuit of the solid-state imaging device according the present embodiment.

First, a configuration of the solid-state imaging device according to the present embodiment is described with reference to FIG. 1 to FIG. 3.

As illustrated in FIG. 1, a solid-state imaging device 100 according to the present embodiment includes a pixel unit 10, a vertical scanning circuit 16, a readout circuit unit 20, an AD conversion circuit unit 30, a ramp signal generating unit 36, a counter circuit unit 50, a horizontal scanning circuit unit 70, and a signal processing circuit unit 80. The pixel unit 10 includes a plurality of pixels 12 arranged in a plurality of rows and a plurality of columns. The readout circuit unit 20 includes column readout circuit units 22 corresponding to the columns, respectively, of the pixel array in the pixel unit 10. Further, the AD conversion circuit unit 30 includes a plurality of column circuit units. Each of the plurality of column circuit units includes a comparison unit 32 and a storage unit 48 corresponding to each column of the pixel array in the pixel unit 10. In FIG. 1, part of circuits and signal lines for controlling a drive pulse necessary for operation of units and timing thereof are omitted for the sake of simplicity of the drawing.

As illustrated in FIG. 2, the pixel 12 includes a photodiode D1, a transfer transistor M1, a reset transistor M2, an amplifier transistor M3, and a select transistor M4. An anode of the photodiode D1 is connected to a ground voltage line, and a cathode of the photodiode D1 is connected to a source of the transfer transistor M1. A drain of the transfer transistor M1 is connected to a source of the reset transistor M2 and to a gate of the amplifier transistor M3. A connecting node (FD in FIG. 2) of the drain of the transfer transistor M1, the source of the reset transistor M2, and the gate of the amplifier transistor M3 forms a floating diffusion node (hereinafter referred to as "FD node"). A drain of the reset transistor M2 and a drain of the amplifier transistor M3 are connected to a power supply voltage line (voltage VDD). A source of the amplifier transistor M3 is connected to a drain of the select transistor M4.

A control signal line 14 is arranged in each row of the pixel array in the pixel unit 10 so as to extend in a row direction (horizontal direction in FIG. 1). The control signal line 14 is a signal line common to pixels 12 arranged in the row direction. The control signal lines 14 are connected to the vertical scanning circuit 16. A predetermined control signal for driving an in-pixel readout circuit in the pixel 12 is output from the vertical scanning circuit 16 to the control signal line 14 at a predetermined timing. In FIG. 1, one control signal line 14 is illustrated for each row, but typically, a plurality of control signal lines are included in each row. In the case of the pixel illustrated in FIG. 2, the control signal line 14 can include a transfer gate signal line connected to a gate of the transfer transistor M1, a reset signal line connected to a gate of the reset transistor M2, and a select signal line connected to a gate of the select transistor M4. A transfer gate signal PTX for driving the transfer transistor M1 is output from the vertical scanning circuit 16 to the transfer gate signal line. A reset signal PRES for driving the reset transistor M2 is output from the vertical scanning circuit 16 to the reset signal line. A select signal PSEL for controlling the select transistor M4 is output from the vertical scanning circuit 16 to the select signal line.

A vertical output line 18 is arranged in each column of the pixel array in the pixel unit 10 so as to extend in a column direction (vertical direction in FIG. 1). The vertical output line 18 is connected to sources of the select transistors M4 of pixels 12 arranged in the column direction, and is a signal line common to those pixels 12.

As illustrated in FIG. 2, the column readout circuit unit 22 includes a constant current source 24 and a column amplifier 26 having a gain of −A. The column amplifier 26 includes a capacitor Cin, a capacitor CO, a reset switch SW1, and a differential amplifier circuit 28. The vertical output line 18 is connected to the constant current source 24 and to a first terminal of the capacitor Cin. A second terminal of the capacitor Cin is connected to an inverting input terminal (denoted as "−" in FIG. 2) of the differential amplifier circuit 28. The capacitor CO and the reset switch SW1 are connected in parallel between the inverting input terminal and an output terminal of the differential amplifier circuit 28. A non-inverting input terminal (denoted as "+" in FIG. 2) of the differential amplifier circuit 28 is connected to a node at a voltage Vn. The output terminal of the differential amplifier circuit 28 also serves as an output terminal of the column readout circuit unit 22.

As illustrated in FIG. 1, the output terminal of the column readout circuit unit 22 in each column is connected to one input terminal of the comparison unit 32 of the AD conversion circuit unit 30 arranged correspondingly to each column. Another input terminal of the comparison unit 32 is connected to a ramp signal line for outputting a ramp signal from the ramp signal generating unit 36. The ramp signal is output from the ramp signal generating unit 36 to the comparison unit 32 via the ramp signal line 38. The ramp signal generating unit 36 is an example of a reference signal supply unit configured to supply a predetermined reference signal to the comparison unit 32. For the sake of convenience of description below, connection between the column readout circuit unit 22 and the comparison unit 32 is sometimes referred to as a signal line 34.

As illustrated in FIG. 3, the comparison unit 32 includes a ramp signal buffer circuit 40, a clipping circuit 42, a comparator circuit 44, a select (SEL) switch SW2, a select inversion (SELB) switch SW3, a clamp capacitor C1, and a feedback (FB) switch SW4.

The output terminal of the column readout circuit unit 22 (signal line 34) is connected to a first terminal of the clamp capacitor C1 via the SEL switch SW2. The ramp signal line 38 is connected to an input terminal of the ramp signal buffer circuit 40. The ramp signal buffer circuit 40 is a reference signal buffer circuit configured to buffer a reference signal supplied from the reference signal supply unit. An output terminal of the ramp signal buffer circuit 40 is connected to the first terminal of the clamp capacitor C1 via the SELB switch SW3.

The clipping circuit 42 is connected to an electrical path through which a ramp signal is input to the comparator circuit 44, specifically, to a connecting node between the ramp signal buffer circuit 40 and the SELB switch SW3. The clipping circuit 42 controls clipping of the potential of output from the ramp signal buffer circuit 40 depending on the potential of an output signal from the column readout circuit unit 22.

The SEL switch SW2 is a switch configured to control connection between the terminals thereof using a control signal SEL. The SELB switch SW3 is a switch configured to control connection between the terminals thereof using a control signal SELB that is an inverted signal of the control signal SEL. For example, when the control signal SEL is at a HIGH level, the SEL switch SW2 is ON, and the SELB switch SW3 is OFF. When the control signal SEL is at a LOW level, the SEL switch SW2 is OFF, and the SELB switch SW3 is ON. The relationship of the signal levels when the SEL switch SW2 and the SELB switch SW3 are operated may be the opposite. That is, it can also be said that the SEL switch SW2 and the SELB switch SW3 are one select switch configured to switch a signal that is input to the first terminal of the clamp capacitor C1 between a signal from the pixel 12 and a ramp signal from the ramp signal generating unit 36.

A second terminal of the clamp capacitor C1 is connected to an inverting input terminal (denoted as "−" in FIG. 3) of the comparator circuit 44. A non-inverting input terminal (denoted as "+" in FIG. 3) of the comparator circuit 44 is connected to a common potential line 46 at a voltage VB. The FB switch SW4 is connected between the inverting input terminal and an output terminal of the comparator circuit 44. The output terminal of the comparator circuit 44 also serves as an output terminal of the comparison unit 32.

The FB switch SW4 is a switch configured to control connection between the terminals thereof using a control signal FB. For example, when the control signal FB is at the HIGH level, the FB switch SW4 is ON, and when the control signal FB is at the LOW level, the FB switch SW4 is OFF. The relationship of the signal levels when the FB switch SW4 is operated may be the opposite.

The FB switch SW4 is a switch for the purpose of initializing the potential of the inverting input terminal of the comparator circuit 44. A means for initializing the potential of the inverting input terminal of the comparator circuit 44 is not necessarily required to be the FB switch SW4, and, for example, a switch configured to connect the inverting input terminal and the non-inverting input terminal of the comparator circuit 44 or a unit configured to supply the voltage VB to the inverting input terminal may also be used.

As illustrated in FIG. 1, the output terminal of the comparison unit 32 of each column is connected to an input terminal of the storage unit 48 in the AD conversion circuit unit 30 arranged correspondingly to each column. The storage unit 48 is connected to a count data line 52 for outputting a count signal (count value) from the counter circuit unit 50. A count signal is output from the counter circuit unit 50 to the storage unit 48 via the count data line 52. The horizontal scanning circuit unit 70 and the signal processing circuit unit 80 are connected to the storage unit 48 of each column.

Next, operation of the solid-state imaging device according to the present embodiment is described with reference to FIG. 1 to FIG. 5.

The pixel unit 10 outputs signals depending on the amount of light incident on the pixels to the vertical output line 18 of each column for the respective rows. Specifically, the procedure below is followed, to thereby output, to the vertical output line 18, a signal depending on the reset potential of the FD node (reset signal) and a signal depending on the amount of signal charge generated by the photodiode D1 (optical signal) from each pixel 12 in the pixel unit 10.

First, the select signal PSEL at the HIGH level is output from the vertical scanning circuit 16 to the control signal line 14, which is connected in the row to be read, to turn on the select transistor M4. This supplies the amplifier transistor M3 with a bias current from the constant current source 24 via the select transistor M4, and a source follower circuit is thus formed.

Then, a transfer gate signal PTX at the HIGH level and the reset signal PRES at the HIGH level are output from the vertical scanning circuit 16 to the control signal line 14, which is connected in the row to be read, to turn on the transfer transistor M1 and the reset transistor M2. This applies a power supply voltage VDD to the photodiode D1 via the transfer transistor M1 and the reset transistor M2 to reset the potential of the photodiode D1. After the reset operation of the photodiode D1 is performed, the transfer gate signal PTX and the reset signal PRES are caused to be at the LOW level to separate the photodiode D1 from the power supply voltage VDD. This starts generation of the signal charge depending on the amount of incident light through photoelectric conversion and accumulation of the generated signal charge at the photodiode D1.

After a predetermined accumulation time period elapses, the reset signal PRES at the HIGH level is output from the vertical scanning circuit 16 to the control signal line 14, which is connected in the row to be read, to turn on the reset transistor M2. This applies the power supply voltage VDD to the FD node via the reset transistor M2 to reset the potential of the FD node. After the reset operation of the FD node is performed, the reset signal PRES is caused to be at the LOW level to separate the FD node from the power supply voltage VDD. This completes the reset operation of the FD node.

At this time, the amplifier transistor M3 is being supplied with the bias current from the constant current source 24 via the select transistor M4, and the source follower circuit is thus formed. Therefore, a signal depending on the reset voltage of the FD node (reset signal) is output to the vertical output line 18 via the select transistor M4.

While the source follower circuit outputs the reset signal, in the column amplifier 26, the column amplifier 26 is reset and a signal corresponding to the reset signal from the pixel 12 is output. Specifically, through turning on the reset switch SW1 to reset the column amplifier 26 and then turning off the reset switch SW1, a signal corresponding to the reset signal is output from an output terminal of the column amplifier 26. The potential of a signal corresponding to the reset signal is the same as the voltage Vn that is input to the non-inverting input terminal of the differential amplifier circuit 28.

Then, the transfer gate signal PTX at the HIGH level is output from the vertical scanning circuit 16 via the control signal line 14 to turn on the transfer transistor M1. This transfers the signal charge, which has been generated and accumulated in the photodiode D1, to the FD node via the transfer transistor M1. Therefore, a signal depending on the amount of the signal charge transferred to the FD node (optical signal) is output to the vertical output line 18 via the select transistor M4.

In this way, before the transfer gate signal PTX transitions from the LOW level to the HIGH level, the reset signal of the pixel is output, and, after the transfer gate signal PTX transitions to the HIGH level, the pixel signal depending on the light amount is output, from the source follower circuit to the vertical output line 18.

When the optical signal is input to the column amplifier 26 via the vertical output line 18, a signal that is −A times as large as the optical signal is output from the output terminal of the column amplifier 26. This signal is a signal corresponding to the optical signal. A gain A of the column amplifier 26 is determined by the ratio between the capacitor Cin and the capacitor CO, i.e., Cin/CO.

The signal corresponding to the reset signal and the signal corresponding to the optical signal that are output from the column readout circuit unit 22 in this way are input to the comparison unit 32 of the AD conversion circuit unit 30. For the sake of simplicity of the description below, "the signal corresponding to the reset signal" and "the signal corresponding to the optical signal" that are output from the column readout circuit unit 22 are sometimes simply referred to as "the reset signal" and "the optical signal," respectively.

The comparison unit 32 compares the potential level of the signal output from the column readout circuit unit 22 and the potential level of the ramp signal, and outputs one of a signal at the HIGH level and a signal at the LOW level depending on the result of the comparison. Specifically, when the magnitude relationship between the potential of the signal output from the column readout circuit unit 22 and the potential of the ramp signal is inverted, the output of the comparison unit 32 transitions from the HIGH level to the LOW level, or from the LOW level to the HIGH level. At the timing at which the output potential of the comparison unit 32 is inverted, the storage unit 48 stores, as digital data, the count value that is output from the counter circuit unit 50.

The comparison is performed for the reset signal and the optical signal of the pixel 12, and digital data of the respective signals is acquired. The digital data stored in the storage unit 48 is transferred to the signal processing circuit unit 80 for each column in sequence depending on a control signal that is output from the horizontal scanning circuit unit 70. The signal processing circuit unit 80 performs signal processing in which the digital data corresponding to the reset signal is subtracted from the digital data corresponding to the optical signal. In this way, digital correlated double sampling (digital CDS) can be realized.

Operation of the comparison unit 32 is described in detail with reference to FIG. 3 and FIG. 4.

It is assumed that, at Time T1, the voltage Vn corresponding to the reset signal of the pixel 12 is output to the signal line 34 connected to the output terminal of the column readout circuit unit 22.

First, at time T1, the control signal SEL and the control signal FB become at the HIGH level so that the SEL switch SW2 is turned on, the SELB switch SW3 is turned off, and the FB switch SW4 is turned on. This connects the signal line 34 to the clamp capacitor C1, and the voltage Vn corresponding to the reset signal of the pixel 12 is applied to the first terminal of the clamp capacitor C1. At this time, the input terminal and the output terminal of the comparator circuit 44 are short-circuited by the FB switch SW4, and a voltage follower is thus formed. Therefore, the output terminal and the inverting input terminal of the comparator circuit 44 are at the same potential as that of the common potential line 46 (voltage VB) connected to the non-inverting input terminal by virtual ground. The potential of the output signal from the ramp signal buffer circuit 40 at this time is represented by Vr.

Then, at time T2, the control signal FB becomes at the LOW level and the FB switch SW4 is turned off. This ends sampling of the voltage Vn to the clamp capacitor C1.

Then, at time T3, the control signal SEL becomes at the LOW level so that the SEL switch SW2 is turned off, and the SELB switch SW3 is turned on. This connects the output terminal of the ramp signal buffer circuit 40 to the first terminal of the clamp capacitor C1. Further, the potential of the inverting input terminal of the comparator circuit 44 is (VB−(Vn−Vr)). After that, processing of AD conversion of the reset signal of the pixel 12 is started, and the ramp signal is input to the inverting input terminal of the comparator circuit 44 via the ramp signal buffer circuit 40.

Then, it is assumed that, at time T4, the magnitude relationship between the potential of the inverting input terminal of the comparator circuit 44 and the voltage VB of the non-inverting input terminal is inverted. This causes the output of the comparator circuit 44 to transition from the LOW level to the HIGH level. The storage unit 48 stores, as the digital data corresponding to the reset signal of the pixel 12, the count value that is output from the counter circuit unit 50 at time T4 at which the output of the comparator circuit 44 is inverted. Counting of the count value that is output from the counter circuit unit 50 is started in synchronization with the start time of ramping of the ramp signal.

Then, at time T5, the potential of the output terminal of the ramp signal buffer circuit 40 returns to Vr, and the output of the digital data corresponding to the reset signal ends.

It is assumed that, at time T6, the column readout circuit unit 22 outputs a signal depending on the optical signal. In this case, as the output signal from the column readout circuit unit 22, three kinds of signals having different potentials are assumed. Those signals are represented by Vs1, Vs2, and Vs3 in ascending order of potential.

The clipping circuit 42 controls clipping of the potential of the output terminal of the ramp signal buffer circuit 40 depending on the potential of the output signal from the column readout circuit unit 22. When the potential of the output signal of the column readout circuit unit 22 is Vs1, the potential is low, and thus, the clipping circuit 42 does not operate. When the potential of the output signal of the column readout circuit unit 22 is Vs2 or Vs3, the clipping circuit 42 operates to clip the output of the ramp signal buffer circuit 40 to a predetermined potential. When the potential of the output signal is Vs2 or Vs3, the potentials after the clipping are represented by Vr2 and Vr3, respectively.

Then, at time T7 after the potential of the output signal from the column readout circuit unit 22 becomes stable, the control signal SEL and the control signal FB transition from the LOW level to the HIGH level. This turns on the SEL switch SW2, turns off the SELB switch SW3, and turns on the FB switch SW4, and sampling of the optical signal to the clamp capacitor C1 starts.

Then, at time T8, the control signal FB transitions from the HIGH level to the LOW level to turn off the FB switch SW4, and the sampling of the optical signal ends.

Then, at time T9, the control signal SEL transitions from the HIGH level to the LOW level so that the SEL switch SW2 is turned off, and the SELB switch SW3 is turned on. This connects the output terminal of the ramp signal buffer circuit 40 to the first terminal of the clamp capacitor C1. At this time, when the output of the column readout circuit unit 22 is Vs1, Vs2, or Vs3, the potential of the inverting input terminal of the comparator circuit 44 is VB−(Vs1−Vr), VB−(Vs2−Vr2), and VB−(Vs3−Vr3), respectively.

In the following, three cases are described, in which the potential of the output signal of the column readout circuit unit 22 is Vs1, Vs2, and Vs3, respectively.

When the potential of the output signal is Vs1, at time T91, the ramp signal is input to the ramp signal buffer circuit 40, the ramp signal buffer circuit 40 outputs a signal depending on the ramp signal, and the processing of AD conversion starts. At time T10, the magnitude relationship between the potential of the inverting input terminal and the potential of the non-inverting input terminal of the comparator circuit 44 is inverted, and the output of the comparator circuit 44 transitions to the HIGH level. After that, at time T111, the clipping circuit 42 operates, and the potential of the output terminal of the ramp signal buffer circuit 40 is clipped. This prevents the potential of the signal that is input to the inverting input terminal of the comparator circuit 44 from increasing further.

When the potential of the output signal is Vs2, at time T91, the ramp signal is input to the ramp signal buffer circuit 40, but the potential of the output terminal of the ramp signal buffer circuit 40 is clipped to Vr2. At time T92, the output potential of the ramp signal buffer circuit 40 becomes higher than Vr2, the clipping is released, and the ramp signal is input to the inverting input terminal of the comparator circuit 44. At Time T11, the magnitude relationship between the potential of the non-inverting input terminal and the potential of the inverting input terminal of the comparator circuit 44 is inverted, and the output of the comparator circuit 44 transitions to the HIGH level.

When the potential of the output signal is Vs3, until time T101, the potential of the output terminal of the ramp signal buffer circuit 40 is clipped to Vr3. At time T101, the output potential of the ramp signal buffer circuit 40 becomes higher than Vr3, the clipping is released, and the ramp signal is input to the inverting input terminal of the comparator circuit 44. At time T12, the magnitude relationship between the potential of the non-inverting input terminal and the potential of the inverting input terminal of the comparator circuit 44 is inverted, and the output of the comparator circuit 44 transitions to the HIGH level.

Through controlling clipping of the potential of the output terminal of the ramp signal buffer circuit 40 with the clipping circuit 42 in this way, even when the amplitude of the ramp signal is larger than the range in which the ramp signal can be input to the comparator circuit 44, the signal that is input to the comparator circuit 44 can be suppressed within the inputtable range. In other words, a conversion range of the AD conversion can be set beyond the inputtable range of the comparator circuit 44, and thus, a high S/N ratio can be realized. Further, the conversion range of the AD conversion is maintained, and still, the voltage of the power supply of the comparator circuit 44 can be lowered.

FIG. 5 is an illustration of an exemplary configuration of the clipping circuit 42 that realizes the operation described above. In the exemplary circuit illustrated in FIG. 5, the clipping circuit 42 includes an n-channel MOS transistor MN1 and a p-channel MOS transistor MP1. A gate of the n-channel MOS transistor MN1 and a gate of the p-channel MOS transistor MP1 are connected to a connecting node between the signal line 34 and the SEL switch SW2. A source of the n-channel MOS transistor MN1 and a source of the p-channel MOS transistor MP1 are connected to a connecting node between the ramp signal buffer circuit 40 and the SELB switch SW3. A drain of the n-channel MOS transistor MN1 is connected to a fixed potential line, e.g., the power supply voltage VDD. A drain of the p-channel MOS transistor MP1 is connected to a fixed potential line, e.g., a ground potential.

When the potential of the output signal of the column readout circuit unit 22 (voltage Vs) is higher than the potential sum of the output of the ramp signal buffer circuit 40 and a threshold voltage Vthn of the n-channel MOS transistor MN1, the output of the ramp signal buffer circuit 40 is clipped to a potential (Vs−Vthn). The potential of the inverting input terminal of the comparator circuit 44 at this time is (VB−(Vs−(Vs−Vthn))=VB−Vthn), and (VB−Vthn) is a lower limit value that is input to the inverting input terminal of the comparator circuit 44. The threshold voltage Vthn of the n-channel MOS transistor MN1 is an absolute value.

On the other hand, when the potential of the output signal of the ramp signal buffer circuit 40 is higher than the potential sum of the voltage Vs of the output signal of the column readout circuit unit 22 and a threshold voltage Vthp of the p-channel MOS transistor MP1, the output of the ramp signal buffer circuit 40 is clipped to (Vs+Vthp). The potential of the inverting input terminal of the comparator circuit 44 at this time is (VB−(Vs−Vr)+Vs+Vthp=VB+Vr+Vthp), and (VB+Vr+Vthp) is an upper limit value that is input to the inverting input terminal of the comparator circuit 44. The threshold voltage Vthp of the p-channel MOS transistor MP1 is an absolute value.

Therefore, use of the clipping circuit 42 illustrated in FIG. 5 limits the potential of the signal that is input to the inverting input terminal of the comparator circuit 44 in a range of from (VB−Vthn) to (VB+Vr+Vthp). Therefore, through appropriately setting those parameters, the potential of the signal that is input to the inverting input terminal of the comparator circuit 44 can be limited to a range in which the signal can be input to the comparator circuit 44.

In the present embodiment, both the upper limit and the lower limit of the potential of the output terminal of the ramp signal buffer circuit 40 are limited by the clipping circuit 42, but the function of the clipping circuit 42 is not limited thereto. For example, the clipping circuit 42 may limit one of the upper limit and the lower limit of the potential of the output signal of the ramp signal buffer circuit 40.

Further, the circuit illustrated in FIG. 5 is described as a circuit configuration configured to clip the potential of the output of the ramp signal buffer circuit 40 depending on the potential of the output signal from the column readout circuit unit 22, but the circuit configuration for realizing a similar function is not limited to the one illustrated in FIG. 5. If the ramp signal buffer circuit 40 is not provided, the clipping of the potential of the output of the ramp signal buffer circuit 40 cannot be controlled for each column. When the clipping of the potential of the output of the ramp signal buffer circuit 40 is controlled for each column, the ramp signal buffer circuit 40 is essential.

Further, the circuit configuration of the column amplifier 26 illustrated in FIG. 2 is only exemplary, and the present invention is not limited thereto. For example, the differential amplifier circuit 28 included in the column amplifier 26 may be a common source amplifier circuit.

As described above, according to the present embodiment, even when the amplitude of the reference signal is larger than the input allowable range of the comparator circuit, the potential of the signal that is input to the comparator circuit can be suppressed within the allowable range. This enables the conversion range of the AD conversion to be set beyond the inputtable range of the comparator circuit, and a high S/N ratio can be realized. Further, the conversion range of the AD conversion is maintained, and still, the voltage of the power supply of the comparator circuit can be lowered.

Second Embodiment

Figure 6:
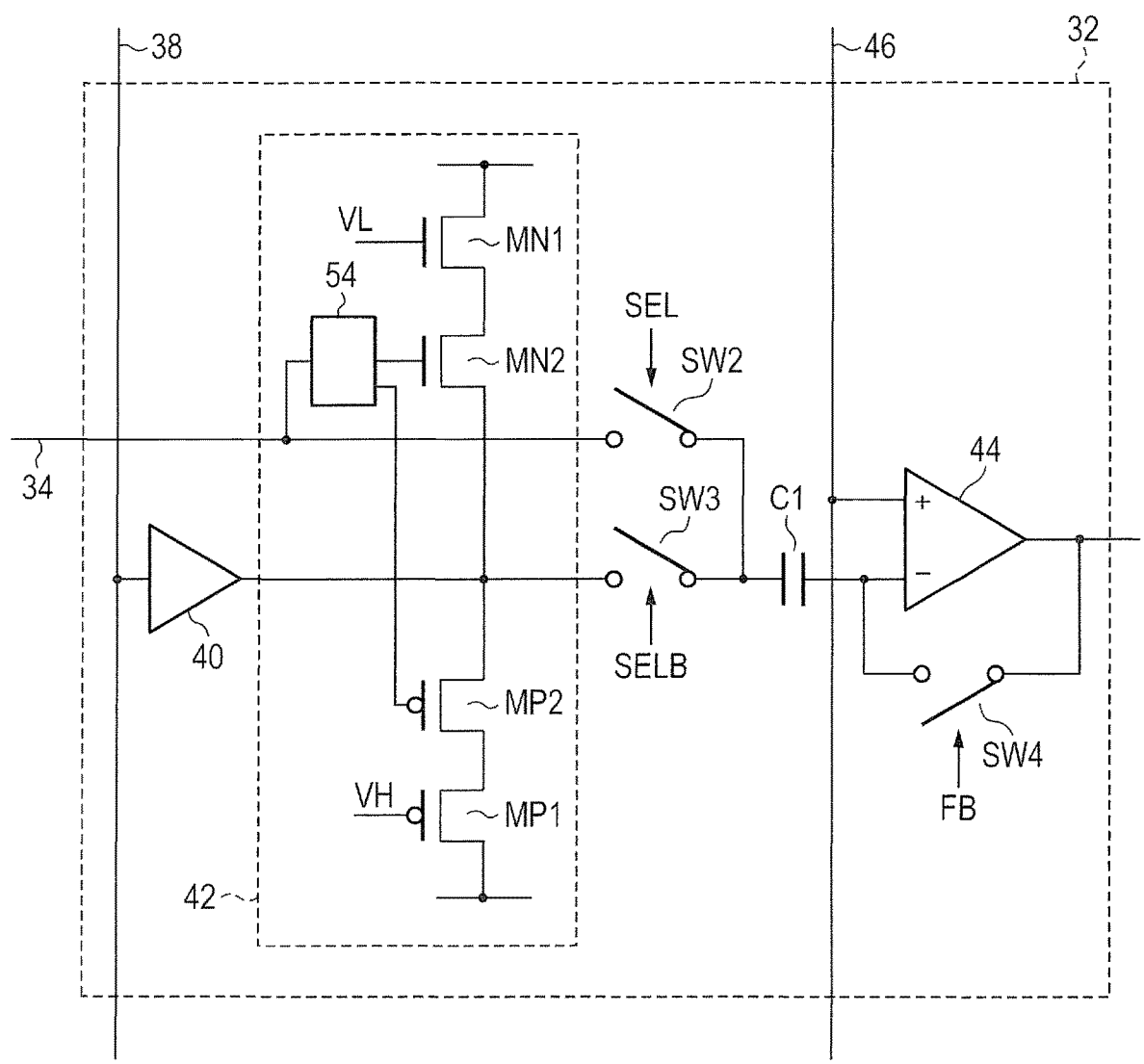
FIG. 6 is a circuit diagram for illustrating a comparison unit of a solid-state imaging device according to a second embodiment of the present invention.
Figure 7:
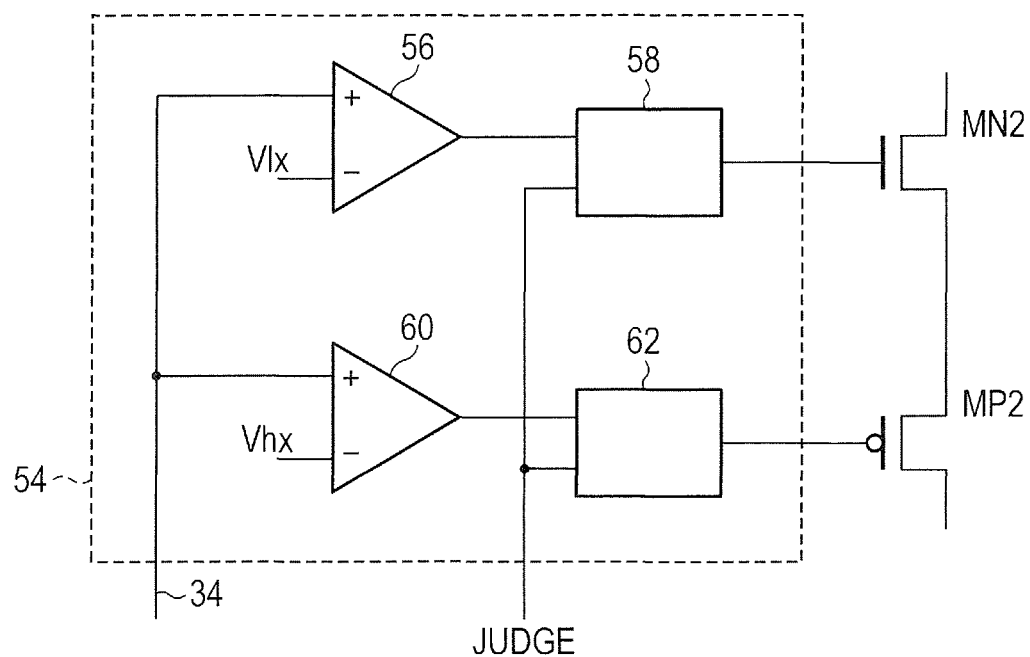
FIG. 7 is a circuit diagram for illustrating a determination circuit of the comparison unit of the solid-state imaging device according to the second embodiment of the present invention.
Figure 8:
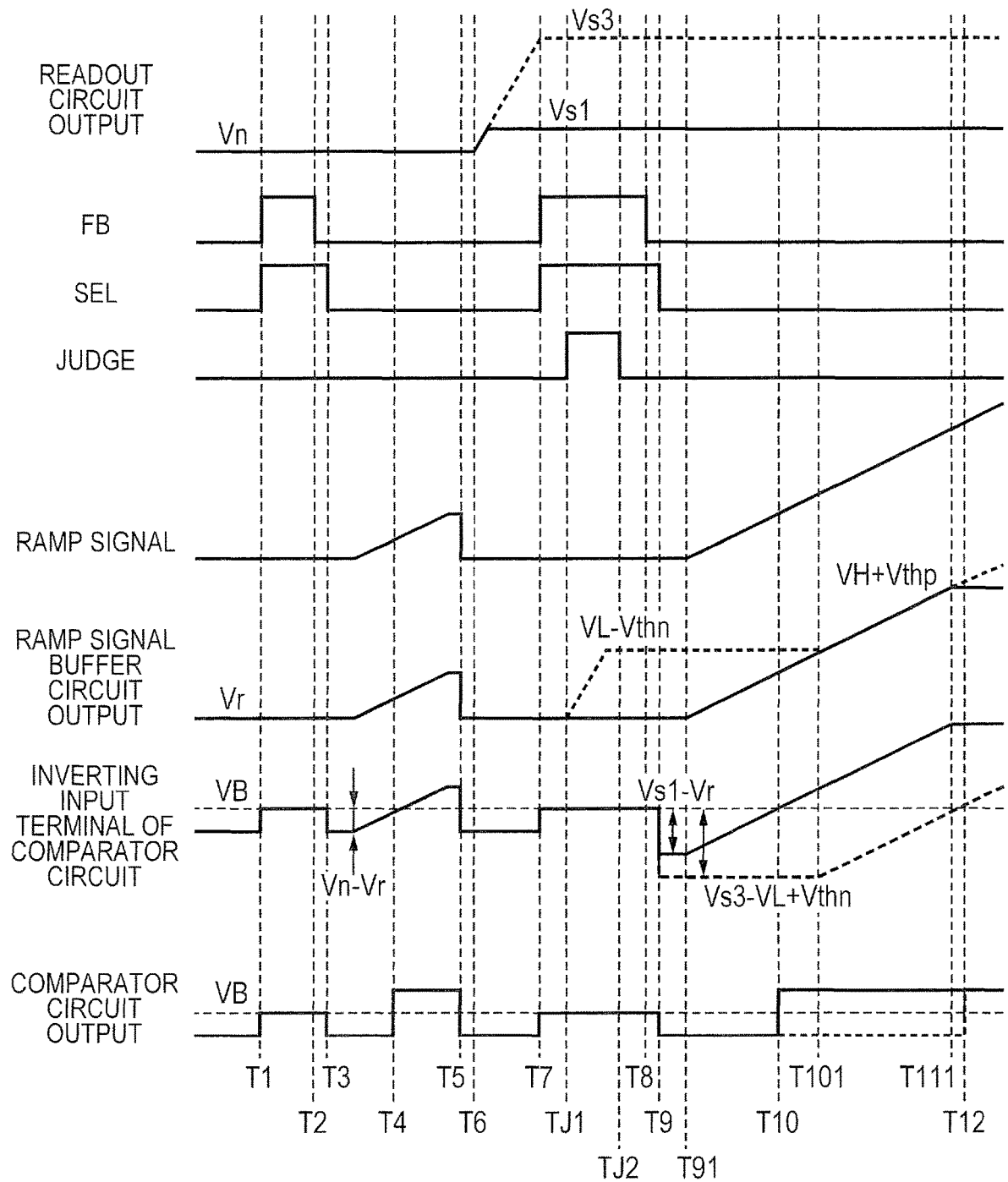
FIG. 8 is a timing chart for illustrating operation of the solid-state imaging device according to the second embodiment of the present invention.

A solid-state imaging device according to a second embodiment of the present invention is described with reference to FIG. 6 to FIG. 8. Like reference symbols are used to denote components similar to those in the solid-state imaging device according to the first embodiment illustrated in FIG. 1 to FIG. 5, and description thereof is omitted or is made only in brief. FIG. 6 is a circuit diagram for illustrating a comparison unit of the solid-state imaging device according to the present embodiment. FIG. 7 is a circuit diagram for illustrating a determination circuit of the comparison unit of the solid-state imaging device according to the present embodiment. FIG. 8 is a timing chart for illustrating operation of the solid-state imaging device according to the present embodiment.

The solid-state imaging device according to the present embodiment is similar to the solid-state imaging device according to the first embodiment except for the configuration of the clipping circuit 42 of the comparison unit 32. Specifically, the clipping circuit 42 according to the present embodiment is, similarly to the clipping circuit 42 according to the first embodiment illustrated in FIG. 3, a circuit configured to control clipping of the potential of the output terminal of the ramp signal buffer circuit 40 depending on the potential of the output signal of the column readout circuit unit 22.

As illustrated in FIG. 6, the clipping circuit 42 according to the present embodiment includes p-channel MOS transistors MP1 and MP2, n-channel MOS transistors MN1 and MN2, and a determination circuit 54. The drain of the re-channel MOS transistor MN1 is connected to a fixed potential line, e.g., the power supply voltage VDD. The source of the n-channel MOS transistor MN1 is connected to a drain of the n-channel MOS transistor MN2. A source of the n-channel MOS transistor MN2 is connected to a source of the p-channel MOS transistor MP2. A drain of the p-channel MOS transistor MP2 is connected to the source of the p-channel MOS transistor MP1. The drain of the p-channel MOS transistor MP1 is connected to a fixed potential line, e.g., the ground potential.

An input terminal of the determination circuit 54 is connected to the connecting node between the signal line and the SEL switch SW2. An output terminal of the determination circuit 54 is connected to a gate of the re-channel MOS transistor MN2 and a gate of the p-channel MOS transistor MP2. A connecting node between the source of the n-channel MOS transistor MN2 and the source of the p-channel MOS transistor MP2 is connected to the connecting node between the ramp signal buffer circuit 40 and the SELB switch SW3. The gate of the n-channel MOS transistor MN1 is connected to a node at a potential VL. The gate of the p-channel MOS transistor MP1 is connected to a node at a potential VH.

The p-channel MOS transistor MP1 is a transistor for upper limit clipping configured to clip a higher-side potential of the output terminal of the ramp signal buffer circuit 40. The p-channel MOS transistor MP2 is a switch for upper limit clipping configured to select whether or not the higher-side potential is clipped. The n-channel MOS transistor MN1 is a transistor for lower limit clipping configured to clip a lower-side potential of the output terminal of the ramp signal buffer circuit 40. The re-channel MOS transistor MN2 is a switch for lower limit clipping configured to select whether or not the lower-side potential is clipped. The determination circuit 54 determines whether the potential of the output signal from the column readout circuit unit 22 is higher or lower than a predetermined potential, and controls on/off of the p-channel MOS transistor MP2 and the n-channel MOS transistor MN2 depending on the result of the determination.

When the lower limit clipping is performed, the n-channel MOS transistor MN2 is controlled to be turned on. When the potential that is input to the gate of the re-channel MOS transistor MN1 is represented by VL and the threshold voltage of the n-channel MOS transistor MN1 is represented by Vthn, the potential of the output of the ramp signal buffer circuit 40 is clipped to (VL−Vthn). At this time, the potential of the inverting input terminal of the comparator circuit 44 is (VB−(Vs−(VL−Vthn))=VB−Vs+VL−Vthn).

On the other hand, when the upper limit clipping is performed, the p-channel MOS transistor MP2 is controlled to be turned on. When the potential that is input to the gate of the p-channel MOS transistor MP1 is represented by VH and the threshold voltage of the p-channel MOS transistor MP1 is represented by Vthp, the potential of the output of the ramp signal buffer circuit 40 is clipped to (VH+Vthp). At this time, the potential of the inverting input terminal of the comparator circuit 44 when the upper limit clipping is performed is (VB−(Vs−Vr)+VH+Vthp) when the lower limit clipping is not performed, and is (VB−Vs−VL−Vthn+VH+Vthp) when the lower limit clipping is performed.

The determination circuit 54 can be formed of, for example, the circuit illustrated in FIG. 7. The determination circuit 54 includes a lower-limit comparator circuit 56, a lower-limit logic circuit 58, an upper-limit comparator circuit 60, and an upper-limit logic circuit 62. Non-inverting input terminals (denoted as "+" in FIG. 7) of the lower-limit comparator circuit 56 and the upper-limit comparator circuit 60 are connected to the signal line 34 from the column readout circuit unit 22. An inverting input terminal (denoted as "−" in FIG. 7) of the lower-limit comparator circuit 56 is connected to a node at a potential Vlx (lower limit comparison potential). An inverting input terminal (denoted as "−" in FIG. 7) of the upper-limit comparator circuit 60 is connected to a node at a potential Vhx (upper limit comparison potential). An output terminal of the lower-limit comparator circuit 56 is connected to an input terminal of the lower-limit logic circuit 58. An output terminal of the upper-limit comparator circuit 60 is connected to an input terminal of the upper-limit logic circuit 62. An output terminal of the lower-limit logic circuit 58 is connected to the gate of the n-channel MOS transistor MN2. An output terminal of the upper-limit logic circuit 62 is connected to the gate of the p-channel MOS transistor MP2. The lower-limit logic circuit 58 and the upper-limit logic circuit 62 are controlled with a control signal JUDGE.

Next, details of operation in the comparison unit of the solid-state imaging device according to the present embodiment are described with reference to FIG. 6 to FIG. 8. Here, description of operation similar to that described above is omitted, and exemplary operation is described mainly with regard to timing at which the determination circuit 54 operates.

Operation until time T6 is similar to that according to the first embodiment. At time T6, a signal depending on the optical signal is output from the column readout circuit unit 22.

At time T7, the control signal SEL and the control signal FB transition from the LOW level to the HIGH level so that the SEL switch SW2 is turned on, the SELB switch SW3 is turned off, and the FB switch SW4 is turned on. This starts sampling of the optical signal.

Then, at time TJ1, the control signal JUDGE transitions from the LOW level to the HIGH level, and the determination circuit 54 operates. The determination circuit 54 determines whether the potential of the output signal from the column readout circuit unit 22 is higher or lower than the predetermined potential, and controls on/off of the p-channel MOS transistor MP2 and the n-channel MOS transistor MN2 depending on the result of the determination.

Then, at time TJ2, the control signal JUDGE transitions from the HIGH level to the LOW level. Operation at and after time T8 is similar to that according to the first embodiment.

In the case of the determination circuit 54 illustrated in FIG. 7, operation described below is performed. The lower-limit comparator circuit 56 compares the potential of the output signal from the column readout circuit unit 22 and the lower limit comparison potential Vlx. The result of the comparison by the lower-limit comparator circuit 56 is output to the lower-limit logic circuit 58. When the control signal JUDGE becomes at the HIGH level, the lower-limit logic circuit 58 stores the result of the comparison by the lower-limit comparator circuit 56, and controls on/off of the n-channel MOS transistor MN2, which serves as the switch for lower limit clipping, based on the stored result of the comparison. Specifically, when the potential of the output signal from the column readout circuit unit 22 is lower than the lower limit comparison potential Vlx, the n-channel MOS transistor MN2 is controlled to be turned on.

Similarly, the upper-limit comparator circuit 60 compares the potential of the output signal from the column readout circuit unit 22 and the upper limit comparison potential Vhx. The result of the comparison by the upper-limit comparator circuit 60 is output to the upper-limit logic circuit 62. When the control signal JUDGE becomes at the HIGH level, the upper-limit logic circuit 62 stores the result of the comparison by the upper-limit comparator circuit 60, and controls on/off of the p-channel MOS transistor MP2, which serves as the switch for upper limit clipping, based on the stored result of the comparison. Specifically, when the potential of the output signal from the column readout circuit unit 22 is higher than the upper limit comparison potential Vhx, the p-channel MOS transistor MP2 is controlled to be turned on.

As described above, through using the circuit described in the present embodiment, the AD conversion range can be increased irrespective of the range of a signal inputtable to the comparator circuit 44, and a high S/N ratio can be realized. Further, the conversion range of the AD conversion is maintained, and still, the voltage of the power supply of the comparator circuit 44 can be lowered.

In the present embodiment, both the upper limit and the lower limit of the potential of the output signal of the ramp signal buffer circuit 40 are limited by the clipping circuit 42, but the function of the clipping circuit is not limited thereto. For example, the clipping circuit 42 may limit one of the upper limit and the lower limit of the potential of the output signal of the ramp signal buffer circuit 40.

Further, in the present embodiment, a case is described, in which the circuit illustrated in FIG. 7 is applied as the determination circuit 54, but a circuit applicable as the determination circuit 54 is not limited to the one illustrated in FIG. 7.

Further, the operation of the comparison unit 32 illustrated in the timing chart of FIG. 8 is only exemplary, and the present invention is not limited thereto. For example, timing of a rising edge and timing of a falling edge of the control signal JUDGE may be different from those illustrated in FIG. 8. If the ramp signal buffer circuit 40 is not provided, the clipping of the potential of the output of the ramp signal buffer circuit 40 cannot be controlled for each column. When the clipping of the potential of the output of the ramp signal buffer circuit 40 is controlled for each column, the ramp signal buffer circuit 40 is essential.

As described above, according to the present embodiment, even when the amplitude of the reference signal is larger than the input allowable range of the comparator circuit, the potential of the signal that is input to the comparator circuit can be suppressed within the allowable range. This enables the conversion range of the AD conversion to be set beyond the inputtable range of the comparator circuit, and a high S/N ratio can be realized. Further, the conversion range of the AD conversion is maintained, and still, the voltage of the power supply of the comparator circuit can be lowered.

Third Embodiment

Figure 9:
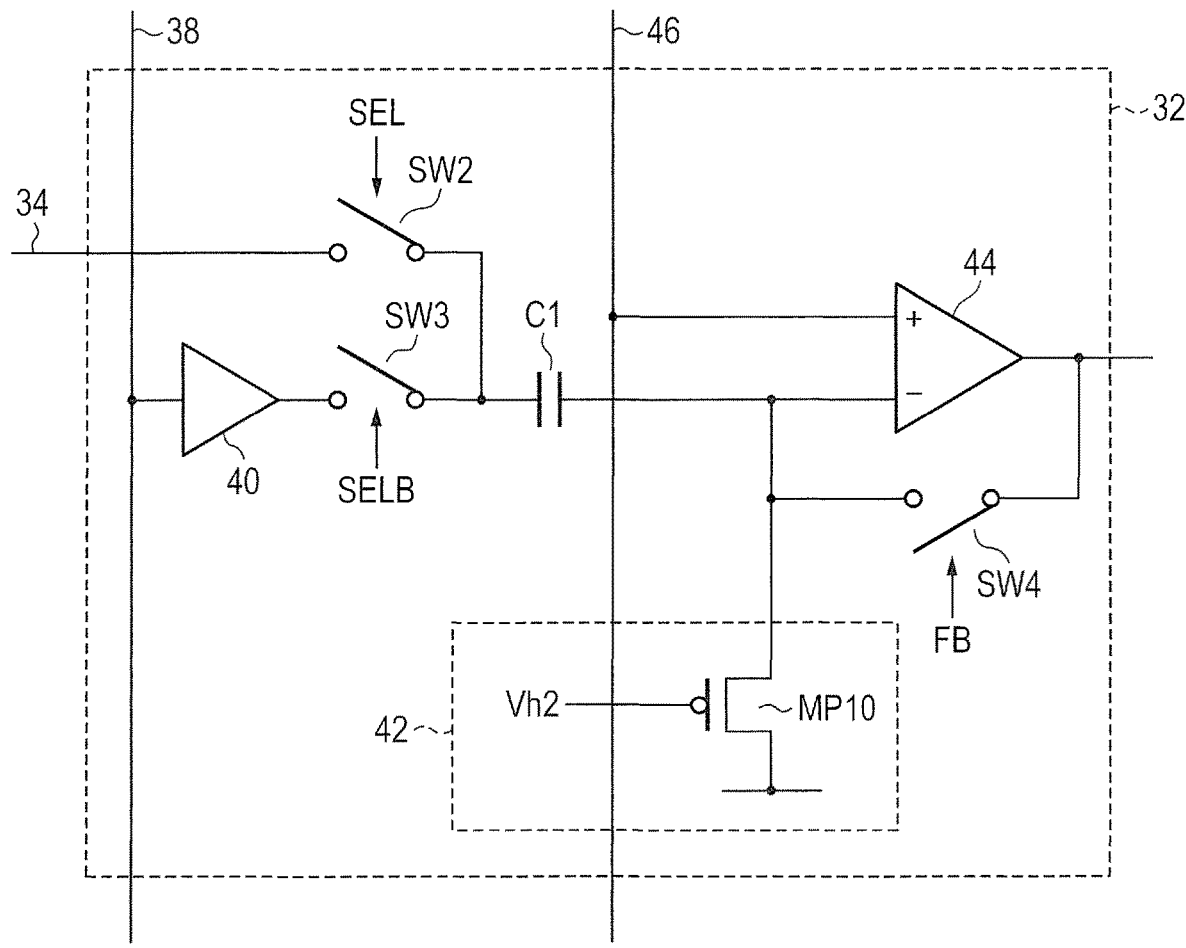
FIG. 9 is a circuit diagram for illustrating a comparison unit of a solid-state imaging device according to a third embodiment of the present invention.
Figure 10:
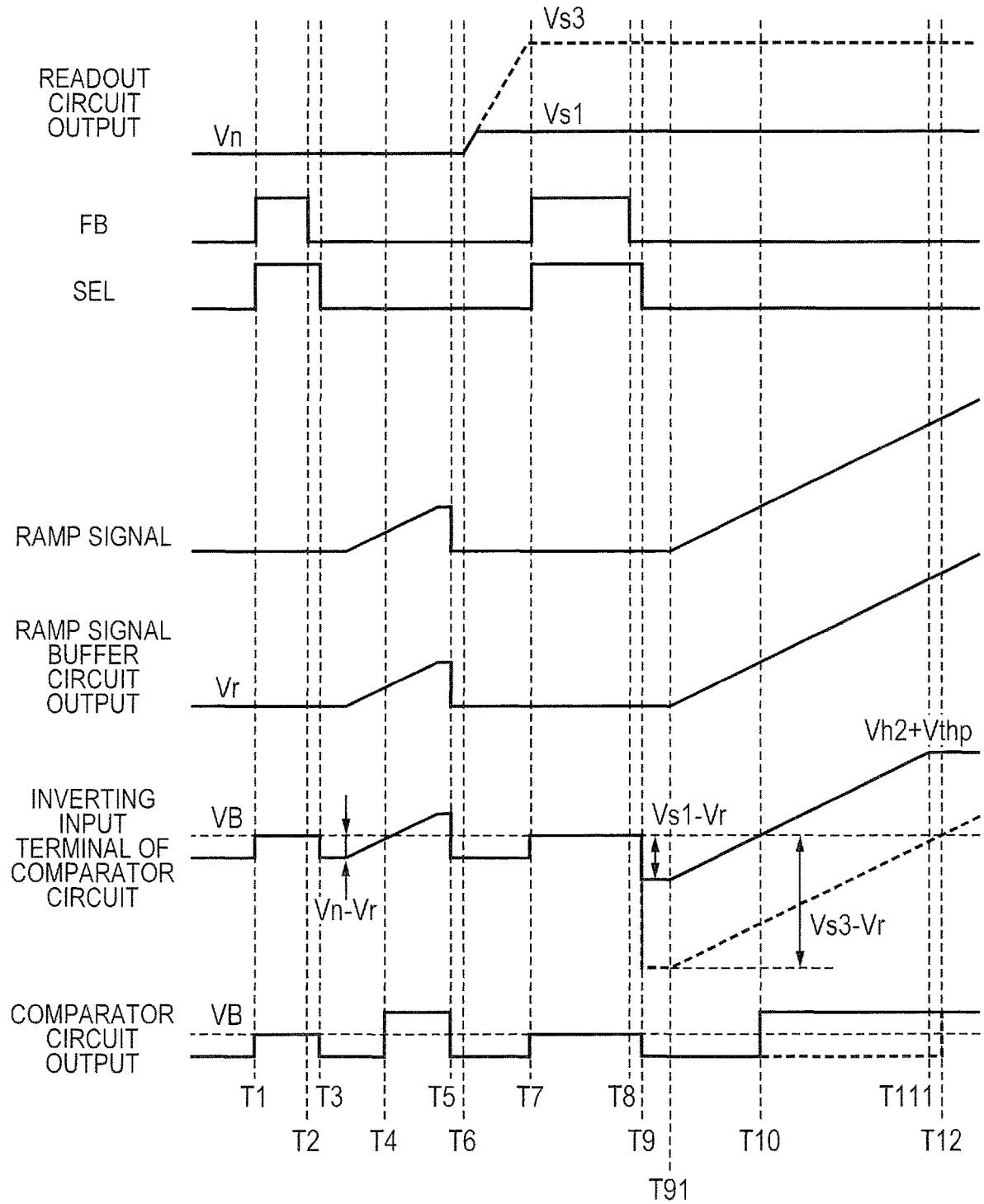
FIG. 10 is a timing chart for illustrating operation of the solid-state imaging device according to the third embodiment of the present invention.

A solid-state imaging device according to a third embodiment of the present invention is described with reference to FIG. 9 and FIG. 10. Like reference symbols are used to denote components similar to those in the solid-state imaging devices according to the first and second embodiments illustrated in FIG. 1 to FIG. 8, and description thereof is omitted or is made only in brief. FIG. 9 is a circuit diagram for illustrating a comparison unit of the solid-state imaging device according to the present embodiment. FIG. 10 is a timing chart for illustrating operation of the solid-state imaging device according to the present embodiment.

The solid-state imaging device according to the present embodiment is similar to the solid-state imaging devices according to the first and second embodiments except for the configuration of the comparison unit 32. More specifically, the solid-state imaging device according to the present embodiment is different from the solid-state imaging devices according to the first and second embodiments in the configuration and the place of arrangement of the clipping circuit 42 of the comparison unit 32. The clipping circuit 42 of the solid-state imaging devices according to the first and second embodiments is for the purpose of clipping the potential of the output terminal of the ramp signal buffer circuit 40. In contrast, the clipping circuit 42 of the solid-state imaging device according to the present embodiment is for the purpose of clipping the potential of the inverting input terminal of the comparator circuit 44. The clipping circuit 42 is connected to an electrical path through which the ramp signal is input to the comparator circuit 44, specifically, to a connecting node between the second terminal of the clamp capacitor C1 and the inverting input terminal of the comparator circuit 44.

As illustrated in FIG. 9, the clipping circuit 42 of the solid-state imaging device according to the present embodiment includes a p-channel MOS transistor MP10. A source of the p-channel MOS transistor MP10 is connected to a connecting node between the clamp capacitor C1 and the inverting input terminal of the comparator circuit 44. A drain of the p-channel MOS transistor MP10 is connected to a fixed potential line, e.g., the ground potential. A gate of the p-channel MOS transistor MP10 is connected to a node at a potential Vh2.

A threshold voltage of the p-channel MOS transistor MP10 is represented by Vthp. When the potential of the inverting input terminal of the comparator circuit 44 exceeds (Vh2+Vthp), the clipping circuit 42 starts the clipping operation. When the clipping circuit 42 starts the clipping operation, the upper limit value of the potential of the inverting input terminal of the comparator circuit 44 is limited to (Vh2+Vthp).

Next, details of operation in the comparison unit of the solid-state imaging device according to the present embodiment are described with reference to FIG. 9 and FIG. 10. Here, description of operation similar to that described above is omitted, and exemplary operation is described mainly with regard to timing at which the clipping circuit 42 operates.

Operation until time T9 is similar to that according to the first embodiment.

At time T9, the control signal SEL transitions from the HIGH level to the LOW level so that the SEL switch SW2 is turned off, and the SELB switch SW3 is turned on. This connects the output terminal of the ramp signal buffer circuit 40 to the first terminal of the clamp capacitor C1 via the SELB switch SW3. The clipping circuit 42 according to the present embodiment limits the upper limit-side potential of the inverting input terminal of the comparator circuit 44, but does not limit the lower limit-side potential thereof. Therefore, at time T9, the lower limit-side potential of the inverting input terminal of the comparator circuit 44 is not clipped.

In this case, when the potential of the output signal from the column readout circuit unit 22 (signal line 34) is Vs1 or Vs3, the potentials of the inverting input terminal of the comparator circuit 44 are (VB−(Vs1−Vr)) and (VB−(Vs3−Vr)), respectively. When the potential of the output signal from the column readout circuit unit 22 is Vs1, the output signal of the comparator circuit 44 is inverted at time T10. When the potential of the output signal from the column readout circuit unit 22 is Vs3, the output signal of the comparator circuit 44 is inverted at time T12. When the potential of the output signal from the column readout circuit unit 22 is Vs1, the potential of the inverting input terminal of the comparator circuit 44 is (Vh2+Vthp) at time T111 and is clipped to (Vh2+Vthp) at and after time T111.

As described above, through limiting the upper limit value of the voltage that is input to the comparator circuit 44, even when the amplitude of the output signal from the ramp signal buffer circuit 40 is larger than an input allowable range of the comparator circuit 44, the potential of the signal that is input to the comparator circuit 44 can be suppressed within the allowable range. Therefore, the conversion range of the AD conversion can be set beyond the inputtable range of the comparator circuit 44, and thus, a high S/N ratio can be realized. Further, the conversion range of the AD conversion is maintained, and still, the voltage of the power supply of the comparator circuit 44 can be lowered.

In the present embodiment, the ramp signal is supplied to the clamp capacitor C1 via the ramp signal buffer circuit 40, but the ramp signal buffer circuit 40 is not necessarily required. If possible, the ramp signal buffer circuit 40 may be omitted.

As described above, according to the present embodiment, even when the amplitude of the reference signal is larger than the input allowable range of the comparator circuit, the potential of the signal that is input to the comparator circuit can be suppressed within the allowable range. This enables the conversion range of the AD conversion to be set beyond the inputtable range of the comparator circuit, and a high S/N ratio can be realized. Further, the conversion range of the AD conversion is maintained, and still, the voltage of the power supply of the comparator circuit can be lowered.

Fourth Embodiment

Figure 11:
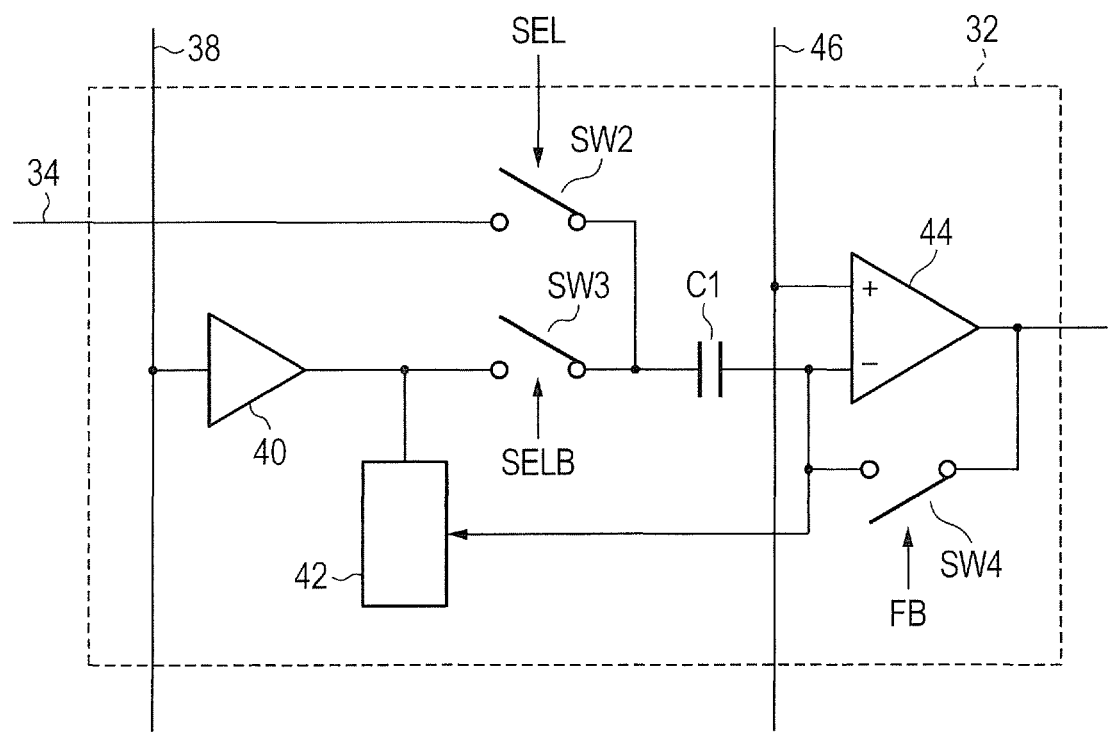
FIG. 11 is a circuit diagram for illustrating a comparison unit of a solid-state imaging device according to a fourth embodiment of the present invention.
Figure 12:
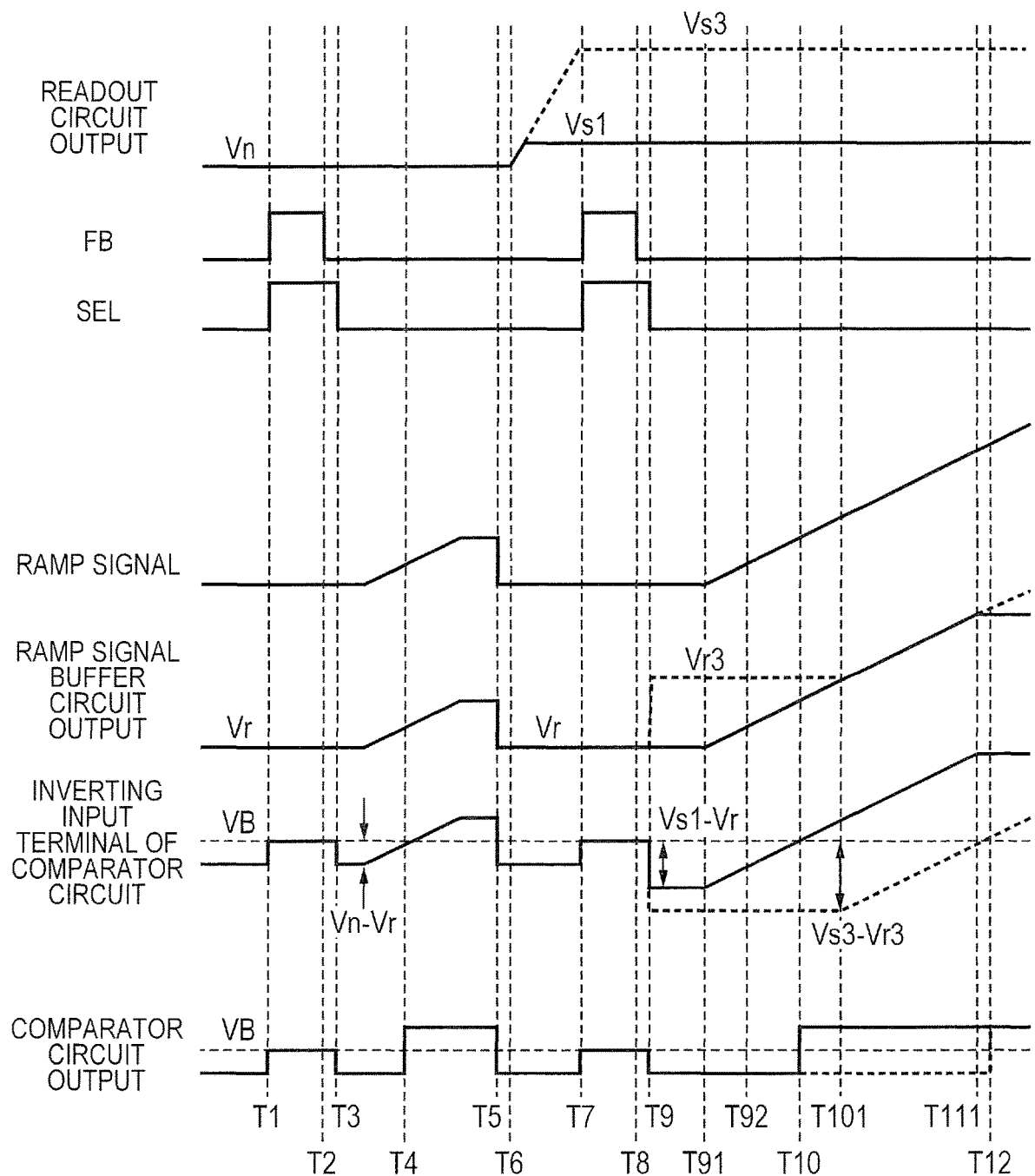
FIG. 12 is a timing chart for illustrating operation of the solid-state imaging device according to the fourth embodiment of the present invention.
Figure 13:
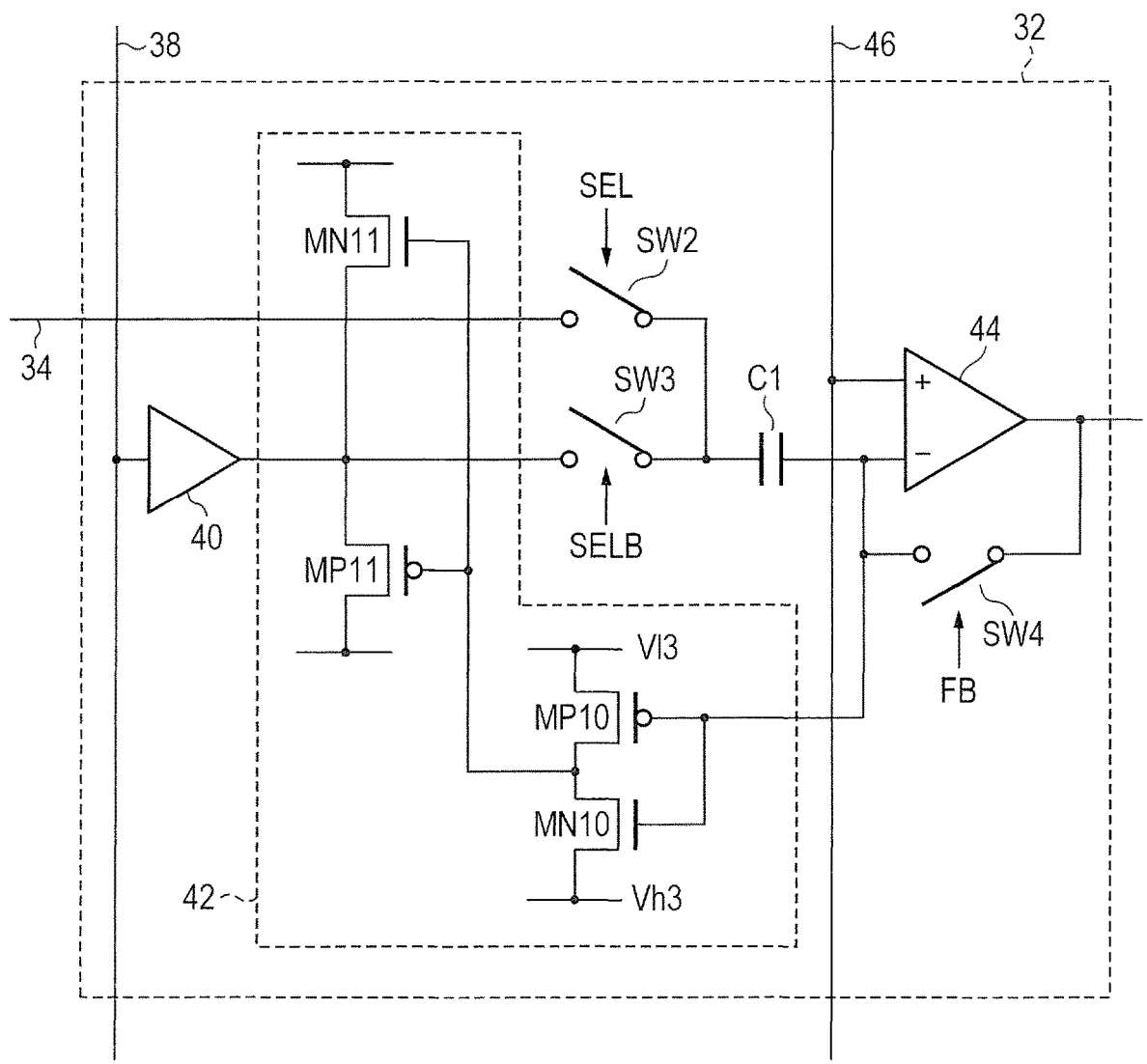
FIG. 13 is a circuit diagram for illustrating an example of a clipping circuit of the comparison unit of the solid-state imaging device according to the fourth embodiment of the present invention.
Figure 14:
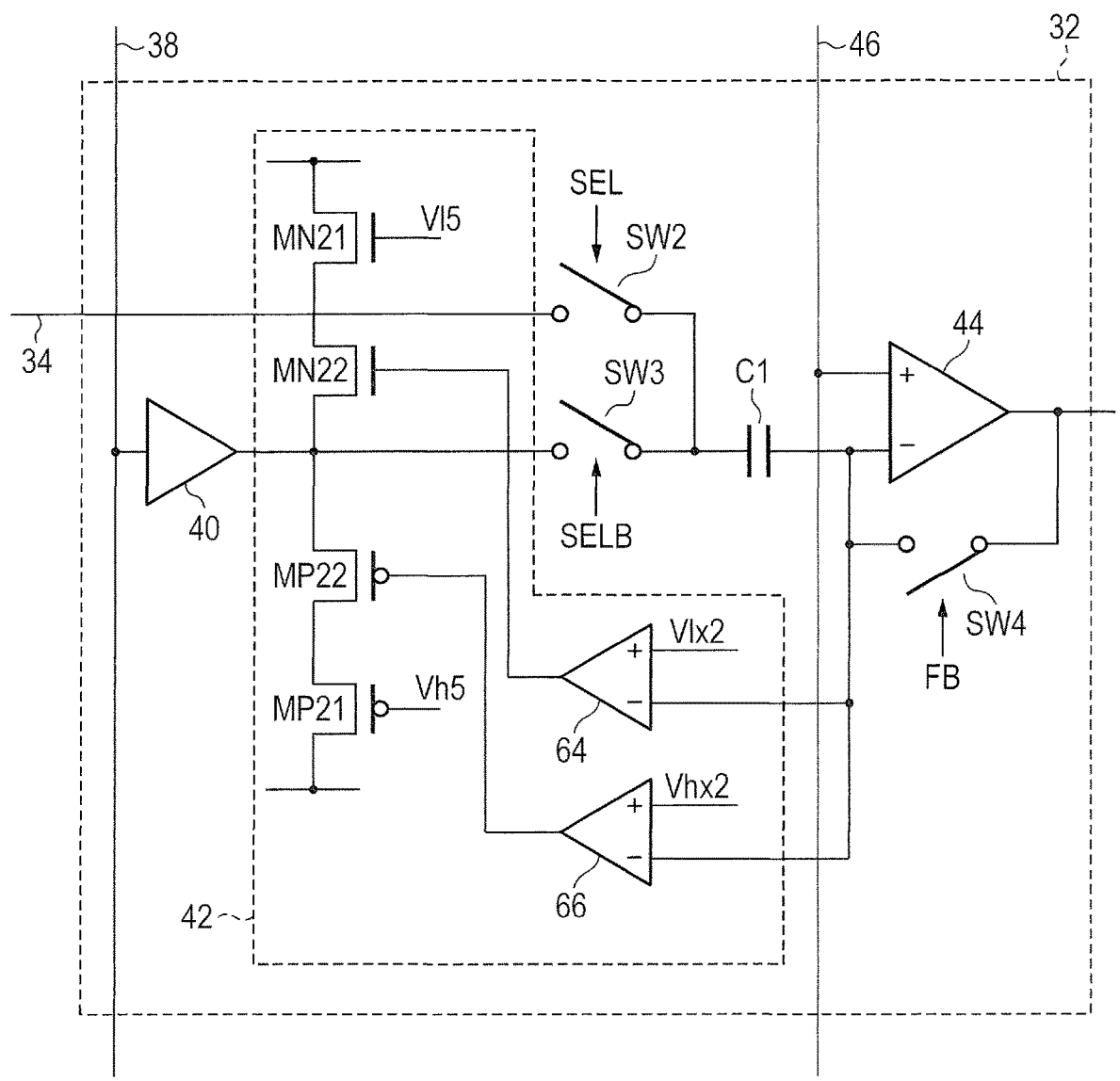
FIG. 14 is a circuit diagram for illustrating another example of the clipping circuit of the comparison unit of the solid-state imaging device according to the fourth embodiment of the present invention.

A solid-state imaging device according to a fourth embodiment of the present invention is described with reference to FIG. 11 to FIG. 14. Like reference symbols are used to denote components similar to those in the solid-state imaging devices according to the first to third embodiments illustrated in FIG. 1 to FIG. 10, and description thereof is omitted or is made only in brief. FIG. 11 is a circuit diagram for illustrating a comparison unit of the solid-state imaging device according to the present embodiment. FIG. 12 is a timing chart for illustrating operation of the solid-state imaging device according to the present embodiment. FIG. 13 and FIG. 14 are circuit diagrams for specifically illustrating examples of the clipping circuit of the comparison unit of the solid-state imaging device according to the present embodiment.

The solid-state imaging device according to the present embodiment is similar to the solid-state imaging devices according to the first and second embodiments except for the configuration of the clipping circuit 42 of the comparison unit 32. More specifically, the solid-state imaging device according to the present embodiment is different from the solid-state imaging devices according to the first and second embodiments in the place at which a reference potential for controlling the clipping is referred to. Specifically, the clipping circuit 42 of the solid-state imaging devices according to the first and second embodiments is configured to refer to the potential of the output signal from the column readout circuit unit as illustrated in FIG. 3. In contrast, the clipping circuit 42 of the solid-state imaging device according to the present embodiment is configured to refer to the potential of the inverting input terminal of the comparator circuit 44 as illustrated in FIG. 11. A terminal used for controlling the clipping of the potential is the output terminal of the ramp signal buffer circuit 40 in both of the cases.

Next, details of operation in the comparison unit of the solid-state imaging device according to the present embodiment are described with reference to FIG. 11 and FIG. 12. Here, description of operation similar to that described above is omitted, and exemplary operation is described mainly with regard to timing at which the clipping circuit 42 operates.

Operation until time T9 is similar to that according to the first embodiment.

At time T9, the control signal SEL transitions from the HIGH level to the LOW level so that the SEL switch SW2 is turned off, and the SELB switch SW3 is turned on. This connects the output terminal of the ramp signal buffer circuit 40 to the first terminal of the clamp capacitor C1 via the SELB switch SW3.

When the potential of the output signal of the column readout circuit unit 22 is low, the clipping circuit 42 does not operate. The potential of the output signal of the column readout circuit unit 22 at this time is represented by Vs1, and the output potential of the ramp signal buffer circuit 40 when the control signal FB is at the HIGH level is represented by Vr. Then, the potential of the inverting input terminal of the comparator circuit 44 at time T9 is (VB−(Vs1−Vr)).

The potential of the output signal of the column readout circuit unit 22 when the potential of the output signal of the column readout circuit unit 22 is high is represented by Vs3. When the potential of the inverting input terminal of the comparator circuit 44 becomes excessively lower than a predetermined potential, the clipping circuit 42 operates to clip the potential of the output terminal of the ramp signal buffer circuit 40. When the output potential of the ramp signal buffer circuit 40 after the clipping is represented by Vr3, the clipped potential of the inverting input terminal of the comparator circuit 44 is (VB−(Vs3−Vr3)).

FIG. 13 is an illustration of an example of the clipping circuit 42 that realizes the operation described above. In the exemplary circuit illustrated in FIG. 13, the clipping circuit 42 includes p-channel MOS transistors MP10 and MP11 and n-channel MOS transistors MN10 and MN11.

The drain of the p-channel MOS transistor MP10 is connected to a drain of the n-channel MOS transistor MN10. The source of the p-channel MOS transistor MP10 is connected to a node at a potential V13. A source of the re-channel MOS transistor MN10 is connected to a node at a potential Vh3. The gate of the p-channel MOS transistor MP10 and a gate of the n-channel MOS transistor MN10 are connected to the inverting input terminal of the comparator circuit 44.

A source of the p-channel MOS transistor MP11 is connected to a source of the n-channel MOS transistor MN11. A drain of the p-channel MOS transistor MP11 is connected to a fixed potential line, e.g., the ground potential. A drain of the n-channel MOS transistor MN11 is connected to a fixed potential line, e.g., the power supply voltage VDD. A gate of the p-channel MOS transistor MP11 and a gate of the n-channel MOS transistor MN11 are connected to a connecting node between the p-channel MOS transistor MP10 and the n-channel MOS transistor MN10. A connecting node between the p-channel MOS transistor MP11 and the n-channel MOS transistor MN11 is connected to a connecting node between the output terminal of the ramp signal buffer circuit 40 and the SELB switch SW3.

Clipping operation of the lower limit potential of the clipping circuit 42 illustrated in FIG. 13 is now described. When the potential of the inverting input terminal of the comparator circuit 44 becomes lower, the re-channel MOS transistor MN10 is turned off, the p-channel MOS transistor MP10 is turned on, and the potential of the gate of the n-channel MOS transistor MN11 and of the gate of the p-channel MOS transistor MP11 is V13. This operates the n-channel MOS transistor MN11, and the potential of the output terminal of the ramp signal buffer circuit 40 is clipped to (V13−Vthn), where Vthn is a threshold voltage of the n-channel MOS transistor MN11. Therefore, the potential of the inverting input terminal of the comparator circuit 44 at this time is (VB−(Vs3−(V13−Vthn))).

Clipping operation of the upper limit potential of the clipping circuit 42 illustrated in FIG. 13 is now described. When the potential of the inverting input terminal of the comparator circuit 44 becomes higher, the p-channel MOS transistor MP10 is turned off, the n-channel MOS transistor MN10 is turned on, and the potential of the gate of the n-channel MOS transistor MN11 and of the gate of the p-channel MOS transistor MP11 is Vh3. This operates the p-channel MOS transistor MP11, and the potential of the output terminal of the ramp signal buffer circuit 40 is clipped to (Vh3+Vthp), where Vthp is a threshold voltage of the p-channel MOS transistor MP11.

FIG. 14 is an illustration of another example of the clipping circuit 42 that realizes the operation described above. In the exemplary circuit illustrated in FIG. 14, the clipping circuit 42 includes a comparator circuit 64 for lower limit clipping, a comparator circuit 66 for upper limit clipping, n-channel MOS transistors MN21 and MN22, and p-channel MOS transistors MP21 and MP22.

An inverting input terminal (denoted as "−" in FIG. 14) of the comparator circuit 64 for lower limit clipping and an inverting input terminal (denoted as "−" in FIG. 14) of the comparator circuit 66 for upper limit clipping are connected to the inverting input terminal of the comparator circuit 44. A non-inverting input terminal (denoted as "+" in FIG. 14) of the comparator circuit 64 for lower limit clipping is connected to a node at a potential Vlx2. An output terminal of the comparator circuit 64 for lower limit clipping is connected to a gate of the n-channel MOS transistor MN22. A non-inverting input terminal (denoted as "+" in FIG. 14) of the comparator circuit 66 for upper limit clipping is connected to a node at a potential Vhx2. An output terminal of the comparator circuit 66 for upper limit clipping is connected to a gate of the p-channel MOS transistor MP22.

A drain of the n-channel MOS transistor MN21 is connected to a fixed potential line, e.g., the power supply voltage VDD. A source of the n-channel MOS transistor MN21 is connected to a drain of the n-channel MOS transistor MN22. A source of the n-channel MOS transistor MN22 is connected to a source of the p-channel MOS transistor MP22. A drain of the p-channel MOS transistor MP22 is connected to a source of the p-channel MOS transistor MP21. A drain of the p-channel MOS transistor MP21 is connected to a fixed potential line, e.g., the ground potential. A gate of the n-channel MOS transistor MN21 is connected to a node at a potential V15. A gate of the p-channel MOS transistor MP21 is connected to a node at a potential Vh5. A connecting node between the n-channel MOS transistor MN22 and the p-channel MOS transistor MP22 is connected to the connecting node between the output terminal of the ramp signal buffer circuit 40 and the SELB switch SW3.

Clipping operation of the lower limit potential of the clipping circuit 42 illustrated in FIG. 14 is now described. When the potential of the inverting input terminal of the comparator circuit 44 is lower than the potential Vlx2, the n-channel MOS transistor MN22 is turned on, and the potential of the output terminal of the ramp signal buffer circuit 40 is clipped to (V15−Vthn), where Vthn is a threshold voltage of the n-channel MOS transistor MN21.

Clipping operation of the upper limit potential of the clipping circuit 42 illustrated in FIG. 14 is now described. When the potential of the inverting input terminal of the comparator circuit 44 is larger than the potential Vhx2, the p-channel MOS transistor MP22 is turned on, and the potential of the output terminal of the ramp signal buffer circuit 40 is clipped to (Vh5+Vthp), where Vthp is a threshold voltage of the p-channel MOS transistor MP21.

As described above, through clipping the potential of the output terminal of the ramp signal buffer circuit 40, even when the amplitude of the ramp signal that is input to the ramp signal buffer circuit 40 is beyond the input allowable range of the comparator circuit 44, the potential of the signal that is input to the comparator circuit 44 is not beyond the allowable range. Therefore, the conversion range of the AD conversion can be set beyond the inputtable range of the comparator circuit 44, and thus, a high S/N ratio can be realized. Further, the conversion range of the AD conversion is maintained, and still, the voltage of the power supply of the comparator circuit 44 can be lowered.

In the present embodiment, two circuits illustrated in FIG. 13 and FIG. 14, respectively, exemplify the clipping circuit 42, but the configuration of the clipping circuit 42 is not limited thereto. It is only necessary that the clipping circuit 42 monitor the node of the inverting input terminal of the comparator circuit 44 and clip the potential of the node of the output of the ramp signal buffer circuit 40. If the ramp signal buffer circuit 40 is not provided, the clipping of the potential of the output of the ramp signal buffer circuit 40 cannot be controlled for each column. When the clipping of the potential of the output of the ramp signal buffer circuit 40 is controlled for each column, the ramp signal buffer circuit 40 is essential.

As described above, according to the present embodiment, even when the amplitude of the reference signal is larger than the input allowable range of the comparator circuit, the potential of the signal that is input to the comparator circuit can be suppressed within the allowable range. This enables the conversion range of the AD conversion to be set beyond the inputtable range of the comparator circuit, and a high S/N ratio can be realized. Further, the conversion range of the AD conversion is maintained, and still, the voltage of the power supply of the comparator circuit can be lowered.

Fifth Embodiment

An imaging system according to a fifth embodiment of the present invention is described with reference to FIG. 9. Like reference symbols are used to denote components similar to those in the solid-state imaging devices according to the first to fourth embodiments illustrated in FIG. 1 to FIG. 14, and description thereof is omitted or is made only in brief. FIG. 9 is a block diagram for illustrating a configuration of the imaging system according to the present embodiment.

Figure 15:
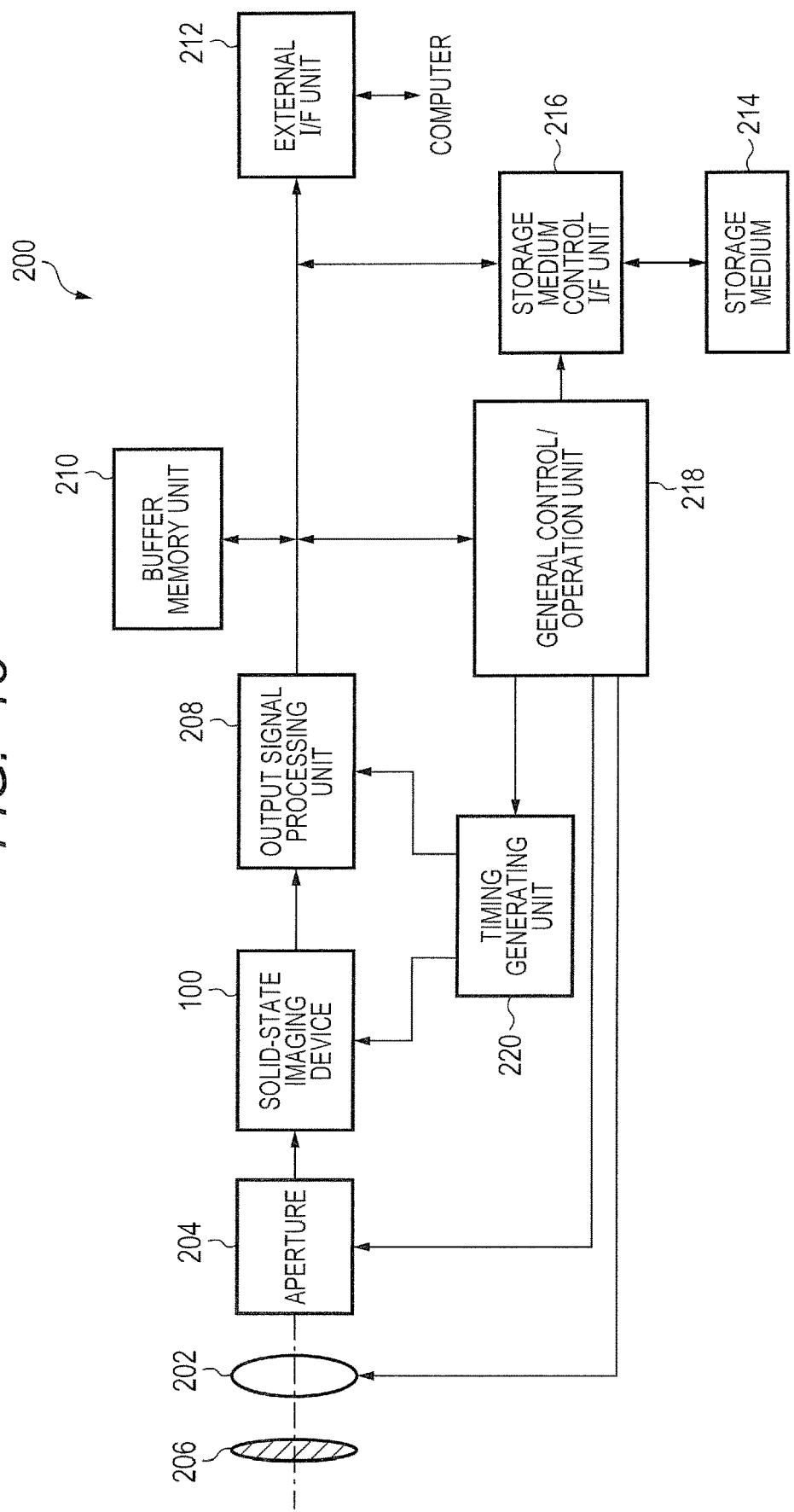
FIG. 15 is a block diagram for illustrating a schematic configuration of an imaging system according to a fifth embodiment of the present invention.

The solid-state imaging devices described in the above-mentioned first to fourth embodiments are applicable to various kinds of imaging systems. Applicable imaging systems include a digital still camera, a digital camcorder, and a monitoring camera, for example. FIG. 15 is an illustration of an exemplary digital still camera to which the solid-state imaging device according to the embodiments described above is applied.

An imaging system 200 exemplified in FIG. 15 includes a solid-state imaging device 100, a lens 202 configured to form an optical image of an object on the solid-state imaging device 100, an aperture 204 configured to vary an amount of light that passes through the lens 202, and a barrier 206 configured to protect the lens. The lens 202 and the aperture 204 form an optical system configured to collect the light into the solid-state imaging device 100. The solid-state imaging device 100 is the solid-state imaging device 100 described in the first to third embodiments.

The imaging system 200 further includes an output signal processing unit 208 configured to process an output signal output from the solid-state imaging device 100. The output signal processing unit 208 performs various kinds of operations including correction and compression as necessary, and outputs a signal. The output signal processing unit 208 may have the function of performing AD conversion processing similarly to the AD conversion circuit unit 30 of the solid-state imaging device 100 described in the first to fourth embodiments. In this case, the solid-state imaging device 100 is not necessarily required to include the AD conversion circuit unit 30.

The imaging system 200 further includes a buffer memory unit 210 configured to temporarily store image data, and an external interface unit (external I/F unit) 212 configured to communicate to/from an external computer and the like. Further, the imaging system 200 includes a storage medium 214 such as a semiconductor memory configured to record or read out imaging data, and a storage medium control interface unit (storage medium control I/F unit) 216 configured to record or read out the imaging data to or from the storage medium 214. The storage medium 214 may be built into the image pickup system 200, or may be removably mounted thereon.

Further, the imaging system 200 includes a general control/operation unit 218 configured to perform various kinds of operations and control for the overall digital still camera, and a timing generating unit 220 configured to output various kinds of timing signals to the solid-state imaging device 100 and the output signal processing unit 208. In this case, the timing signals may be input from the outside, and the imaging system 200 only needs to include at least the solid-state imaging device 100 and the output signal processing unit 208 configured to process the output signal output from the solid-state imaging device 100.

Through forming the imaging system using the solid-state imaging device 100 according to the first to fourth embodiments, a high S/N ratio can be realized and the voltage of the power supply of the comparator circuit can be lowered. This enables realization of a low power consumption imaging system that can acquire a better quality image.

Modified Embodiment

The present invention is not limited to the embodiments described above, and various kinds of modifications thereof are possible.

For example, in the first to fourth embodiments described above, the comparator circuit 44 is described as a two-input circuit, but the comparator circuit 44 is not necessarily required to be a two-input circuit. For example, a one-input circuit such as an inverter circuit or a single-ended amplifier including a common source circuit may also be applied. In those cases, the common potential line 46 is not necessary.

Further, in the first to fourth embodiments described above, the column amplifier 26 is provided for amplifying the pixel signal to increase the range of a signal that is input to the comparison unit 32. This is because, as the range of the signal that is input to the comparison unit 32 increases more, a greater effect can be expected. For example, a pixel signal is small when a dark image is taken, but, through amplification using the column amplifier 26, the range of the signal that is input to the comparison unit 32 can be increased.

However, the column amplifier 26 is not necessarily required, and a node (vertical output line 18) between the pixel source follower and the constant current source 24 may be directly connected to the comparison unit 32. In that case, it is necessary to appropriately invert potential change in a signal in the timing chart or a ramp signal.

Further, in the first to fourth embodiments described above, the control signal SELB is described as an inverted signal of the control signal SEL, but the control signal SELB is not necessarily required to be an inverted signal of the control signal SEL. For example, the control signal SELB and the control signal SEL may be separate signals.

Further, the timings of driving the signals are not limited to those in the first to fourth embodiments described above with reference to FIG. 4, FIG. 8, FIG. 10, and FIG. 12. Insofar as operation of the solid-state imaging device is not hindered, the order of the timings described in the above embodiments may be reversed.

Further, in the first to fourth embodiments described above, as the ramp signal buffer circuit 40, for example, a source follower or a voltage follower can be suitably used.

Further, the various kinds of clipping circuits in the first to fourth embodiments described above may be arbitrarily combined. For example, as an upper limit clipping circuit, a circuit described in any one of the first to fourth embodiments may be used, and, as a lower limit clipping circuit, another circuit described in another of the first to fourth embodiments may be used.

Further, in the first to fourth embodiments described above, the column circuit units of the AD conversion circuit unit 30 are arranged correspondingly to the columns, respectively, of the pixel array, but a column circuit unit may be arranged for a plurality of columns.

Further, in the first to fourth embodiments described above, the comparison unit 32 is described as forming the AD conversion circuit unit 30 and comparing a signal from a pixel and a reference signal, but the comparison unit described in the above embodiments may be any comparator configured to output a signal depending on the result of comparison between a first signal and a second signal.

Further, the sources and the drains of the transistors in the embodiments described above have typical exemplary names, and, depending on the conductivity types of the transistors and operation to which attention is given, the names of the sources and the drains may be interchanged.

Further, the imaging system described in the fifth embodiment is an exemplary imaging system to which the solid-state imaging device according to the present invention can be applied, and an imaging system to which the solid-state imaging device according to the present invention can be applied is not limited to the configuration illustrated in FIG. 15.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-159755, filed Aug. 13, 2015, which is hereby incorporated by reference herein in its entirety.

What is claimed is:

1. A solid-state imaging device comprising:
a pixel including a photoelectric conversion unit configured to output a pixel signal;
a reference signal supply circuit configured to output a reference signal;
a comparator circuit including a first input terminal, a second input terminal and an output terminal;
a capacitor including a first terminal and a second terminal, the first terminal being connected to the first input terminal of the comparator circuit; and
a selector circuit connected to the second terminal of the capacitor,
wherein:
the selector circuit is configured to select one from the pixel signal and the reference signal and to input a selected signal into the second terminal of the capacitor,
a first voltage is supplied to the second input terminal of the comparator circuit,
the selector circuit includes a first switch and a second switch, both connected to the second terminal of the capacitor, and
the selector circuit has a first state where the first switch is on and the second switch is off for selecting the pixel signal and a second state where the first switch is off and the second switch is on for selecting the reference signal, and
the solid-state imaging device further comprising a clipping circuit including a first transistor connected to the first input terminal of the comparator circuit.

2. The solid-state imaging device according to claim 1, wherein:
a first control signal is supplied to the first switch and a second control signal which is an inverted signal of the first control signal is supplied to the second switch.

3. The solid-state imaging device according to claim 1, further comprising a feedback switch configured to connect the first input terminal and the output terminal of the comparator circuit.

4. The solid-state imaging device according to claim 3, further comprising a buffer circuit arranged between the reference signal supply circuit and the second switch of the selector circuit.

5. The solid-state imaging device according to claim 4, wherein:
a first control signal is supplied to the first switch, and a second control signal which is an inverted signal of the first control signal is supplied to the second switch.

6. The solid-state imaging device according to claim 5, wherein:
the pixel and other pixels each including a corresponding photoelectric conversion unit are arranged to form a plurality of columns, and
a plurality of column circuits are provided correspondingly to the plurality of columns, each of the plurality of column circuits includes a corresponding comparator circuit, a corresponding capacitor, a corresponding selector circuit, a corresponding feedback switch and a corresponding buffer circuit.

7. The solid-state imaging device according to claim 1, wherein the clipping circuit further includes a second transistor,
wherein:
a gate of the first transistor and a gate of the second transistor are both connected to the second terminal of the capacitor via the first switch, and
one of a drain and a source of the first transistor and one of a drain and a source of the second transistor are both connected to the second terminal of the capacitor via the second switch.

8. The solid-state imaging device according to claim 7, wherein:
one of the first and second transistors is configured to define an upper limit for a signal to be input to the comparator circuit, and
the other of the first and second transistors is configured to define an lower limit for the signal to be input to the comparator circuit.

9. The solid-state imaging device according to claim 7, further comprising a determination circuit connected to the gate of the first transistor and to the gate of the second transistor,
wherein the determination circuit is configured to control the first transistor and the second transistor respectively to be on or off so as to activate or inactivate a clip operation of the clip circuit.

10. The solid-state imaging device according to claim 9, wherein:
the determination circuit is configured to receive the pixel signal, and
the determination circuit is configured to control the first transistor and the second transistor based on the pixel signal.

11. The solid-state imaging device according to claim 6, wherein the clipping circuit further includes a second transistor, wherein:
a gate of the first transistor and a gate of the second transistor are both connected to the second terminal of the capacitor via the first switch, and
one of a drain and a source of the first transistor and one of a drain and a source of the second transistor are both connected to the second terminal of the capacitor via the second switch.

12. The solid-state imaging device according to claim 1, wherein:
a gate of the first transistor is connected to the second terminal of the capacitor via the first switch, and
one of a drain and a source of the first transistor is connected to the second terminal of the capacitor via the second switch.

13. The solid-state imaging device according to claim 12, wherein the first transistor is configured to define either an upper limit or a lower limit for a signal to be input to the comparator circuit.

14. The solid-state imaging device according to claim 12, further comprising a determination circuit connected to the gate of the first transistor,
wherein the determination circuit is configured to control the first transistor to be on or off so as to activate or inactivate a clip operation of the clip circuit.

15. The solid-state imaging device according to claim 14, wherein:
the determination circuit is configured to receive the pixel signal, and
the determination circuit is configured to control the first transistor based on the pixel signal.

16. The solid-state imaging device according to claim 6, wherein:
a gate of the first transistor is connected to the second terminal of the capacitor via the first switch, and
one of a drain and a source of the first transistor is connected to the second terminal of the capacitor via the second switch.

17. The solid-state imaging device according to claim 1, wherein one of a source and a drain of the first transistor is connected to the first input terminal of the comparator circuit.

18. The solid-state imaging device according to claim 1, wherein a gate of the first transistor is connected to the first input terminal of the comparator circuit.

19. The solid-state imaging device according to claim 18, wherein one of a source and a drain of the first transistor is connected to the second terminal of the capacitor via the second switch.

20. The solid-state imaging device according to claim 19, wherein the clipping circuit is configured to clip a potential of a signal to be input to the comparator circuit based on a potential of the first input terminal of the comparator circuit.

21. An imaging system comprising:
a solid-state imaging device according to claim 1; and
a signal processing unit configured to generate an image using a signal that is output from the solid-state imaging device.

* * * * *